(12) United States Patent
Maeda et al.

(10) Patent No.: US 9,006,580 B2
(45) Date of Patent: Apr. 14, 2015

(54) METHOD OF MANUFACTURING MULTILAYER WIRING SUBSTRATE, AND MULTILAYER WIRING SUBSTRATE

(75) Inventors: Shinnosuke Maeda, Nagoya (JP); Hajime Saiki, Nagoya (JP); Satoshi Hirano, Nagoya (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 358 days.

(21) Appl. No.: 13/490,850

(22) Filed: Jun. 7, 2012

(65) Prior Publication Data

US 2012/0312590 A1 Dec. 13, 2012

(30) Foreign Application Priority Data

Jun. 9, 2011 (JP) .................. 2011-129371
Jun. 9, 2011 (JP) .................. 2011-129372
Apr. 16, 2012 (JP) .................. 2012-092657

(51) Int. Cl.
*H05K 1/03* (2006.01)
*H05K 3/02* (2006.01)
(Continued)

(52) U.S. Cl.
CPC ............ *H05K 3/4007* (2013.01); *H05K 1/0269* (2013.01); *H01L 23/49822* (2013.01); *H01L 21/4857* (2013.01); *H01L 23/544* (2013.01); *H01L 21/6835* (2013.01); *H05K 1/113* (2013.01); *H05K 3/4602* (2013.01); *H05K 3/4682* (2013.01); *H05K 2201/09781* (2013.01); *H05K 2203/072* (2013.01); *H05K 2203/1105* (2013.01); *H01L 2224/16225* (2013.01);
(Continued)

(58) Field of Classification Search
USPC .................. 174/255, 261; 29/846
See application file for complete search history.

(56) References Cited

U.S. PATENT DOCUMENTS 5,703,709 A 12/1997 Mori et al.

FOREIGN PATENT DOCUMENTS

EP 0885685 A1 12/1998
EP 1130530 A2 5/2001
(Continued)

OTHER PUBLICATIONS

Japanese Patent Office, Notice of Reason of Rejection, issued in corresponding Japanese Application Serial No. 2011-129371, issue/mail date Apr. 16, 2014.
(Continued)

*Primary Examiner* — Jeremy C Norris
(74) *Attorney, Agent, or Firm* — Stites & Harbison PLLC; Jeffrey A. Haeberlin

(57) ABSTRACT

Disclosed is a method of manufacturing a multilayer wiring substrate having a principal plane of the substrate and a rear plane thereof, having a structure such that a plurality of resin insulating layers and a plurality of conductor layers are laminated, and a plurality of chip component connecting terminals to which chip components are connectable are disposed on the principal plane of the substrate. This method has a feature including a plating layer forming process in which product plating layers which provide the plurality of chip component connecting terminals and a dummy plating layer on the surrounding of the product plating layers are formed on the surface of an exposed outermost resin insulating layer at the principal plane of the substrate. This method permits a thickness dispersion of the chip component connecting terminals to be suppressed and permits a connection reliability thereof to the chip components to be increased.

10 Claims, 16 Drawing Sheets

(51) Int. Cl.
*H05K 3/10* (2006.01)
*H05K 3/40* (2006.01)
*H05K 1/02* (2006.01)
*H01L 23/498* (2006.01)
*H01L 21/48* (2006.01)
*H01L 23/544* (2006.01)
*H01L 21/683* (2006.01)
*H05K 1/11* (2006.01)
*H05K 3/46* (2006.01)

(52) U.S. Cl.
CPC ............... *H01L2924/19105* (2013.01); *H01L 2221/68331* (2013.01); *H01L 2221/68345* (2013.01); *H01L 2221/68381* (2013.01); *H01L 2223/54406* (2013.01); *H01L 2223/5442* (2013.01); *H01L 2223/54426* (2013.01); *H01L 2223/54433* (2013.01); *H01L 2223/54486* (2013.01)

(56) References Cited

FOREIGN PATENT DOCUMENTS

| | | |
|---|---|---|
| JP | 01-144695 A | 6/1989 |
| JP | H01-144695 A | 6/1989 |
| JP | H04-112595 A | 4/1992 |
| JP | H07-164170 A | 6/1995 |
| JP | H08-288626 A | 11/1996 |
| JP | H09-18148 A | 1/1997 |
| JP | H09-47889 A | 2/1997 |
| JP | H09-90606 A | 4/1997 |
| JP | H09-116243 A | 5/1997 |
| JP | H11-313967 A | 11/1999 |
| JP | 2001-144205 A | 5/2001 |
| JP | 2002-056347 A | 2/2002 |
| JP | 2002-204057 A | 7/2002 |
| JP | 2003-051650 A | 2/2003 |
| JP | 2005-272874 A | 10/2005 |
| JP | 2005-277115 A | 10/2005 |
| JP | 2009-283541 A | 12/2009 |
| KR | 10-2011-0021435 | 3/2011 |
| TW | 200726353 A | 4/2008 |

OTHER PUBLICATIONS

Taiwan Patent Office, Office Action, issued in corresponding Taiwan Application Serial No. 201120308, issue/mail date Oct. 29, 2014 (translation unavailable).

Korean Patent Office, Office Action, issued in corresponding Korean Application Serial No. 10-2012-0061662, issue/mail date Oct. 28, 2014 (translation unavailable).

METHOD OF MANUFACTURING MULTILAYER WIRING SUBSTRATE, AND MULTILAYER WIRING SUBSTRATE

TECHNICAL FIELD

The present invention relates to a multilayer wiring substrate having a plurality of chip component connecting terminals to which chip components are connectable arranged on a principal plane of the substrate and its manufacturing method.

BACKGROUND OF THE INVENTION

In recent years, a semiconductor integrated circuit chip (an IC chip) used as a microprocessor of a computer and so forth has become a higher-speed processing capability and a higher functionality. In this addition, there is a tendency of becoming increased number of terminals and of narrowing inter-terminal pitches in the IC chip. In general, a multiple number of terminals are densely collected and arrayed on a bottom surface of the IC chip. Such a terminal group as described above is connected to a terminal group of a mother board side in a form of a flip-chip. However, since a large difference in the inter-terminal pitch is present between the terminal group of the IC chip and the terminal group of the mother board side, it is difficult to connect directly the IC chip onto the mother board. Therefore, a technique such that, ordinarily, a semiconductor package in which the IC chip is to be mounted on an IC chip mounting wiring substrate is prepared and this semiconductor package is mounted on the mother board has been adopted.

A multilayer wiring substrate constituted by laminating a plurality of resin insulating layers and a plurality of conductor layers is used as the IC chip mounting wiring substrate constituting this package. Then, a plurality of IC chip connecting terminals to be connected to the IC chip are installed on a principal plane of this multilayer wiring substrate. Then, a plurality of mother board connecting terminals to be connected to the motor board (mother substrate) are installed on a rear plane of the substrate. In such a kind of multilayer wiring substrates as described above, wiring patterns of the conductor layers and IC chip connecting terminals are formed through copper plating in order to achieve a fine pitching thereof (for example, refer to a Japanese Patent Application first Publication (tokkai) No. 2005-272874). Furthermore, in such a kind of multilayer wiring substrates as described above, IC chip positioning recognition marks (alignment marks) are installed on the principal plane side of the is substrate (for example, refer to a Japanese Patent Application first Publication (tokkai) No. 2002-204057).

SUMMARY OF THE INVENTION

Task to be Solved by the Invention

Incidentally, in the multilayer wiring substrate, a rate of area of a copper plating layer formed at an inner layer side (a rate of area of the conductor layers) ordinarily ranges about between 60% and 80%. On the other hand, the rate of area of the copper plating layer on the principal plane of the substrate (the rate of area of each IC chip connecting terminal) often indicates smaller than 10%. In addition, generally, the IC chip connecting terminals are disposed to be deviated toward a center of the principal plane of the substrate. In this case, when the copper plating layer of the IC chip connecting terminals is formed, a concentration of a plating current occurs and a dispersion of a thickness of the copper plating layers occurs. Consequently, a connection reliability between the respective IC chip connecting terminals of the multilayer wiring substrate and the IC chips is reduced. It should be noted that, although connecting terminals to which chip components such as chip capacitors other than the IC chip that are connected are often disposed on the principal plane of the substrate, the dispersion of the thickness on these connecting terminals is also developed in the same way.

The Japanese Patent Application first Publication (tokkai) No. 2005-272874 discloses a technique such that a current density of the plating is gradually increased from an initial stage of the current density to suppress the dispersions of shapes and heights of conductor bumps. Even if this technique is adopted, the concentration of the plating current cannot be avoided in a case where the IC chip connecting terminals are disposed so as to be deviated toward the center of the principal plane of the substrate. Hence, the dispersion of the thickness of the copper plating layer occurs. The above-described task is assumed as a first task.

A first feature according to the present invention is made in view of the first task. An object of the present invention is to provide a method of manufacturing a multilayer wiring substrate which is capable of suppressing the dispersion of thicknesses of the chip component connecting terminals and which can increase a reliability of connection with the chip components.

Incidentally, in the above-described conventional multilayer wiring substrate, an opening is formed within an outermost resin insulating layer and a plating is carried out for an exposed conductor layer to form a recognition mark. This recognition mark is a mark recognized according to a difference in an optical reflectance between a surface of the plating layer and a surface of the resin insulating layer. In addition, such a multilayer wiring substrate on which a positioning mark to position the wiring substrate itself and recognition marks of a product number, a manufacturing lot number, and so forth are formed except the IC chip alignment mark has been put into practice. In a case where the above-described recognition marks are formed, a forming process to form the opening and the conductor layer and a plating process are needed. In addition, in general, the plating for the recognition marks are carried out in the same plating process as the plating for the IC chip connecting terminals. There are some cases where, in this plating process, a gold plate which is relatively expensive is treated in order to secure a solder wettability. Therefore, such a problem that a manufacturing cost of the multilayer wiring substrate is increased occurs. The above-described task is assumed as a second task.

A second feature according to the present invention is made in view of the second task. An object of the present invention is to provide a multilayer wiring substrate which can form the recognition marks on the principal plane of the substrate at a low cost. In addition, another object is to provide a method of manufacturing a multilayer wiring substrate suitable for manufacturing the above-described multilayer wiring substrate.

Means for Solving the Task

According to the first feature of the present invention, as means for solving the above-described task (means 1), a method (a first method) of manufacturing a multilayer wiring substrate, the multilayer wiring substrate having a principal plane of the substrate and a rear plane of the substrate, having a structure such that a plurality of resin insulating layers and a plurality of conductor layers are laminated, and having a plurality of chip component connecting terminals to which chip components are connectable, the method comprising a plating layer forming process for forming product plating layers which provide the plurality of chip component connecting terminals on a surface of one of the resin insulating layers which is an outermost layer and is exposed at the principal plane side of the substrate and forming a dummy plating layer on surroundings of the product plating layers.

According to the invention described in means 1, the plating layer forming process is carried out so that the dummy plating layer is formed on the surroundings of the product plating layers and the product plating layers which provide the chip component connecting terminals are formed on the principal plane of the multilayer wiring substrate. In this case, the rate of area of the plating layers on the principal plane of the substrate can be increased, the concentration of the plating current can be avoided, and the dispersion of the thickness of the product plating layers can be eliminated. Consequently, the respective chip component connecting terminals can be formed on the principal plane of the multiplayer wiring substrate with a uniform thickness. Thus, the reliability of connection between respective chip component connecting terminals and the chip components can be improved.

According to the method of manufacturing the multilayer wiring substrate (first method), the method, preferably, further includes: a resist forming process for forming etching resists to cover the product plating layers on the principal plane side of the substrate; and a plating layer removing process for removing the dummy plating layer exposed at the principal surface of the substrate through an etching. In this case, only the product plating layers which provide the chip component connecting terminals are left on the principal plane of the multilayer wiring substrate. Therefore, the plating to improve the solder wettability can assuredly be formed on only the surfaces of the product plating layers. In addition, such a problem that the chip components are erroneously connected to the dummy plating layers can be avoided.

The dummy plating layer such that a rate of area of the plating layers to a surface area of the principal plane of the substrate is equal to or larger than 60% but equal to or smaller than 95% is preferably formed. Thus, an avoidance of the concentration of the plating current can be assured and the product plating layers can be formed with a uniform thickness.

In addition, in a case where the multilayer wiring substrate having no core substrate is manufactured, the method includes: a lamination process for laminating the plurality of resin insulating layers and the plurality of conductor layers on a supporting base material via a metal foil; and a base material separating process for separating the supporting base material at an interface of the metal foil to expose the metal foil at the rear plane side of the substrate. If the plating layer removing process follows the base material separating process, the dummy plating layer on the principal plane of the substrate can be removed through the etching and, at the same time, a metal foil on a rear plane of the substrate can be removed through the etching. Therefore, the multilayer wiring substrate can be manufactured at the same labor hour as compared with the conventional manufacturing method and the manufacturing cost can be suppressed to be low.

A plurality of IC chip connecting terminals to which an IC chip is connectable and a plurality of capacitor connecting terminals to which chip capacitors are connectable, the IC chip connecting terminals and the capacitor connecting terminals constituting the chip component connecting terminals, may be mounted on the principal plane of the multilayer wiring substrate. In this case, the product plating layers of the plurality of IC chip connecting terminals and the product plating layers of the plurality of capacitor connecting terminals may be formed with the uniform thickness and the connection reliability between the chip component connecting terminals and IC chip and the chip capacitors can be improved.

A pattern shape of the dummy plating layer is not specifically limited but can appropriately be modified in accordance with the shape and the area rate of the product plating layers. Specifically, the dummy plating player may be a plane shaped pattern having a wide area (a solid pattern) or a plane shaped pattern having meshes. Furthermore, the dummy plating layer may have a pattern corresponding to a shape and a size of the adjacent one of the product plating layers.

In the plating layer forming process, a filled via to connect between the conductor layer at an inner layer side and the chip component connecting terminals is preferably formed at the same time when the product plating layers and the dummy plating layer are formed.

In addition, the dummy plating layer may preferably be formed in such a way that the rate of area of the dummy plating layer is larger than that of the product plating layers by 10 times or more. Thus, even if the rate of area of the product plating layers is small, the avoidance of the current concentration at a time of the plating can be assured.

The product plating layers and dummy plating layer may preferably be formed through a copper plating. If the product plating layers are formed through the copper plating, an electrical resistance of the chip component connecting terminals can be suppressed to be low.

In addition, although, in the plating layer forming process, the rate of area of the dummy plating layer occupied in a dummy plating layer forming region defined by an outer edge of the dummy plating layer can arbitrarily be set, this rate of area may be set, for example, to be equal to or larger than 30% but to be equal to or smaller than 100%. In this case, the dummy plating layer may preferably be formed in such a way that a distance between each of the product plating layers and the dummy plating layer is equal to or longer than 0.1 mm but is equal to or shorter than 10 mm. Thus, the avoidance of the current concentration at a time of the plating can be assured. It should be noted that, in a case where the rate of area of the dummy plating layer is relatively large, the above-described distance may be set to be large. On the contrary, in a case where the rate of area of the dummy plating layer is relatively small, the above-described distance may be set to be small.

Suppose, herein, a case where the plurality of chip component connecting terminals are the plurality of IC chip connecting terminals to which the IC chip as one of the chip components is connectable. In addition, suppose a case where a longitudinal size of a rectangular shaped chip mounting region in which the plurality of IC chip connecting terminals are arrayed is X (cm), a lateral size thereof is Y(cm), and a design value of a thickness of the product plating layers at the plurality of IC chip connecting terminals is Z(μm). At this time, a standard deviation σ(μm) of actually measured values of the thickness of the product plating layers is expressed in the following equation. It should be noted that the design value Z(μm) can be expressed in an average value (μm) of the thickness of the product plating layers at the plurality of IC chip connecting terminals.

$$\sigma \leq 1.5 \times (Z/15) \times \left(\frac{\sqrt{X^2 + Y^2}}{\sqrt{2}}\right).$$

According to the second feature of the present invention, as means (means 2) for solving the above-described task, a multilayer wiring substrate comprising: a principal plane of the substrate; a rear plane of the substrate; a plurality of resin insulating layers; a plurality of conductor layers, both of the plurality of resin insulating layers and the plurality of conductor layers being laminated; and a plurality of chip component connecting terminals to which chip components are connectable, wherein one of the plurality of resin insulating layers which is an outermost layer exposed onto the principal plane of the substrate is provided with a recognition mark formed according to a difference between shades of a color of a resin surface.

According to the present invention as described in means 2, the recognition mark is formed on the principal plane of the substrate which provides the plane on which the chip components are mounted according to the difference in shades of color of the resin surface. In this case, since the recognition mark can be recognized without formation of the conductor layer and the opening section as in the case of the conventional art, the manufacturing cost of the multilayer wiring substrate can be suppressed.

The multilayer wiring substrate may, furthermore, include a conductor section which is exposed onto an outer edge section of the principal plane of the substrate and a positioning mark which is recognized according to a difference in an optical reflectance between the resin surface of one of the resin insulating layers which is the outermost layer and the surface of the conductor section. In this case, the recognition mark according to the difference in the shades of the color and the positioning mark according to the difference in the optical reflectance can be formed according to purposes. It should be noted that if, with the number of forming positioning marks according to the difference in the optical reflectance as a minimum limit, the other recognition marks are formed according to the difference in the shades of the color, the increase in the manufacturing cost can be suppressed to be low. In addition, the recognition marks formed according to the difference in the shades of color can be utilized as positioning marks for chip components and so forth.

The multilayer wiring substrate may furthermore include a pattern formed according to a difference between shades of the color of the resin surface and in which a picture of a predetermined pattern is regularly arrayed, in one of the resin insulating layers which is the outermost layer exposed at the principal plane side of the substrate.

In this way, since the pattern is formed on the principal plane of the substrate, a design characteristic of the multilayer wiring substrate can be increased by forming the pattern on the principal plane of the substrate.

As another means (means 3) for solving the above-described task, a method of manufacturing the multilayer wiring substrate described in means 2, the method (a second method) of manufacturing the multilayer wiring substrate comprises: a plating layer forming process for forming product plating layers which provide the plurality of chip component connecting terminals on a surface of the outermost resin insulating layer which is exposed at the principal plane side of the substrate and forming a dummy plating layer having a shape corresponding to the recognition mark; a recognition mark forming process for changing a color of the surface of the outermost insulating layer by a heat treatment for the outermost resin insulating layer; and a dummy plating layer removing process for removing the dummy plating layer through an etching after forming etching resists to cover the product plating layers at the principal plane side of the substrate.

According to the invention described in means 3, the heat treatment is carried out for the outermost resin insulating layer in the recognition mark forming process after the dummy plating layer is formed in the plating layer forming process. At this time, the color of the surface of the exposed outermost resin insulating layer is changed and, on the other hand, the color of the surface of the resin insulating layer covered with the dummy plating layer is not changed.

Thereafter, at the dummy plating layer removing process, the dummy plating layer is removed through the etching so that the surface of the resin insulating layer whose color is not changed is exposed. Consequently, the difference in the shades of the color according to the pattern shape of the dummy plating layer is developed on the resin surface so that the recognition mark according to the difference in the shades of the color can be formed.

The recognition mark forming process preferably serves as annealing for the resin insulating layers. Specifically, the heat treatment at the recognition mark forming process is a treatment at which a hot wind is applied onto the surface of the exposed resin insulating layer. In this case, it is not necessary to perform such annealing process and recognition mark forming process as have conventionally been carried out during the substrate manufacture through the separately independent heat treatments. Consequently, the manufacturing cost of the multilayer wiring substrate can be suppressed to be low.

In addition, the manufacturing method (the second method) according to the present invention may, preferably, be applied as the method of manufacturing a coreless wiring substrate having no core substrate. Specifically, the method of manufacturing the coreless wiring substrate further comprises: a lamination process for laminating the plurality of resin insulating layers and the plurality of conductor layers on a supporting base material via a metal foil; and a base material separating process for separating the supporting base material at an interface of the metal foil to expose the metal foil at the rear plane side of the substrate.

Then, if the plating layer removing process follows the base material separating process, at the same time when the dummy plating layer on the principal plane side of the substrate is removed through the etching, the metal foil on the rear plane side of the substrate can be removed. Therefore, the multilayer wiring substrate can be manufactured at the same labor hour as the conventional manufacturing method and the manufacturing cost can be suppressed to be low.

The resin insulating layers constituting the multilayer wiring substrate may preferably be formed using build-up materials mainly constituted by a thermosetting resin. Specific examples of the forming material of the resin insulating layers are listed as a thermosetting resin such as an epoxy resin, a phenol resin, an urethane resin, a silicone resin, and a polyimide resin, or so forth. In this addition, a composite material between these resins and an organic fiber such as a glass fiber (glass woven fabric or nonwoven glass fabric), a polyamide fiber, or so forth or a resin-resin composite material and so forth in which the thermosetting resin such as an epoxy resin is impregnated in a three-dimensional reticulated fluorine-based resin base material such as a continuously porous PTFE and so forth may be used.

Each of the conductor layers constituting the multilayer wiring substrate is mainly constituted by copper and is formed by a well known technique such as a subtractive process, a semi-additive process, a full-additive process, or so forth. Specifically, for example, such a technique as the copper foil etching, an electroless copper plating, or an electrolytic copper plating is applied. It is possible to form the conductor layers through the etching after the formation of a thin film through a technique such as a sputtering or CVD and to form the conductor layers through a printing of a conductive paste and so forth.

It should be noted that electronic components such as chip resistors, chip inductors, and so forth can be listed as the chip components other than the IC chip and the chip capacitors. In addition, as the IC chip, the IC chip used as a microprocessor of a computer and IC chips used as DRAM (Dynamic Random Access Memory) and SRAM (Static Random Access Memory) can be listed.

PREFERRED EMBODIMENTS TO CARRY OUT THE FIRST FEATURE OF THE PRESENT INVENTION

[First Embodiment]

Figure 1:
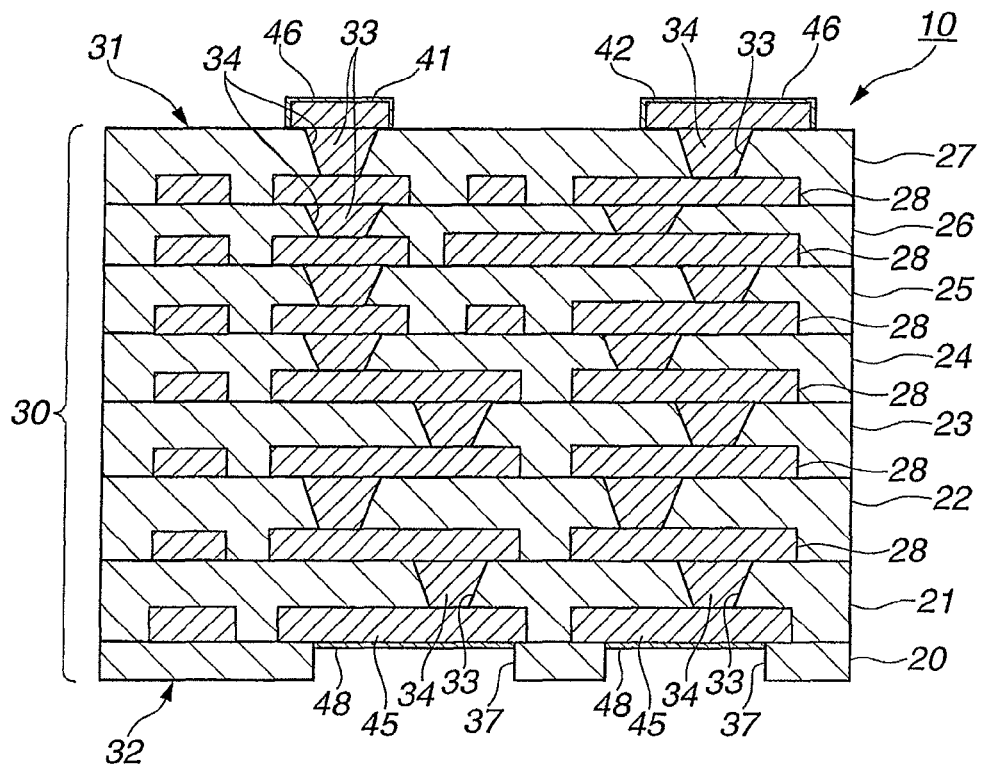
FIG. 1 is a cross sectional view representing a rough configuration of a multilayer wiring substrate in a first preferred embodiment.

Hereinafter, a first preferred embodiment which embodies the first feature of the present invention to a multilayer wiring substrate will be described in details with reference to accompanied drawings. FIG. 1 shows an enlarged cross sectional view of a rough configuration of a multilayer wiring substrate in the first embodiment and FIG. 2 shows a plan view of the multilayer wiring substrate as viewed from an upper surface side of the multilayer wiring substrate.

Figure 2:
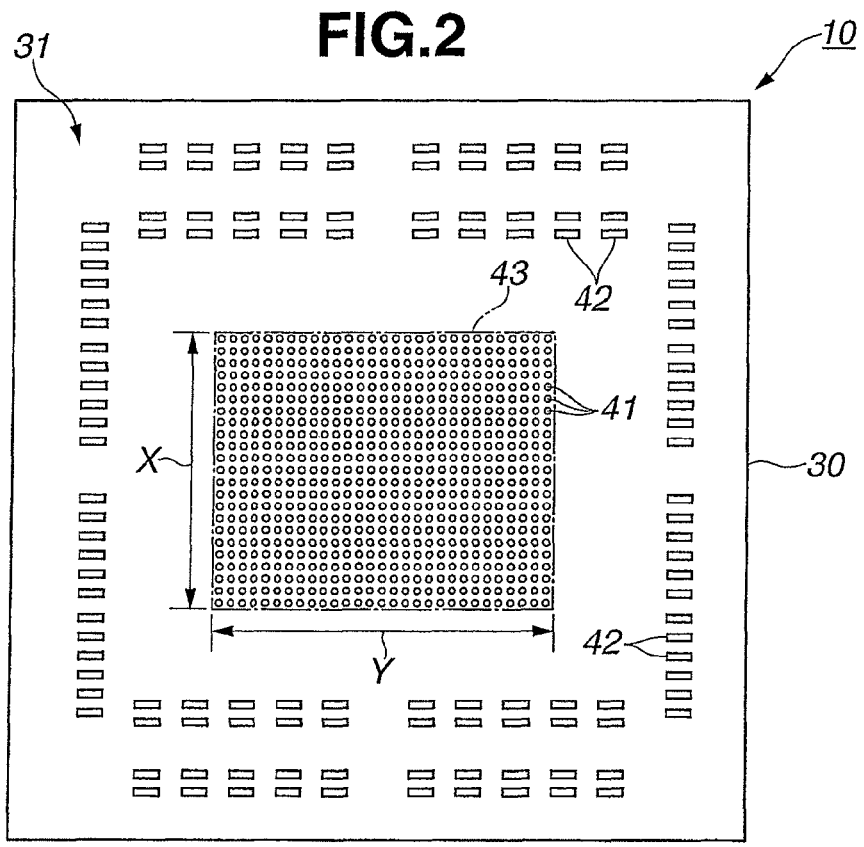
FIG. 2 is a plan view representing a rough configuration of the multilayer wiring substrate in the first preferred embodiment.

As shown in FIGS. 1 and 2, a multilayer wiring substrate 10 in this preferred embodiment according to the present invention is a coreless wiring substrate formed to exclude a core substrate. Multilayer wiring substrate 10 includes a wiring lamination section 30 having a plurality of resin insulating layers 20, 21, 22, 23, 24, 25, 26, 27, with the same resin insulating material as a main material, and a plurality of conductor layers 28 made of copper laminated on one another alternatively to provide a multilayer structure. Each of resin insulating layers 20 through 27 is, for example, formed using a build-up material mainly composed of a thermosetting epoxy resin.

A plurality of IC chip connecting terminals 41 (chip component connecting terminals) which are an IC chip (a chip component) as an object to be connected and a plurality of capacitor connecting terminals 42 (chip component connecting terminals) which are chip capacitors as the objects to be connected are arranged on an upper surface 31 side of wiring lamination section 30 (a principal plane side of the substrate), in multilayer wiring substrate 10 in this embodiment. On upper surface 31 of wiring lamination section 30, a plurality of IC chip connecting terminals 41 are arrayed in a chip mounting region 43 provided at a center section of the substrate. In addition, capacitor connecting terminals 42 are connecting terminals having a larger area than IC chip connecting terminals and are arranged at an outer peripheral side than chip mounting region 43. It should be noted that, as shown in FIG. 2, chip mounting region 43 in this embodiment is a rectangular chip mounting region 43 having a longitudinal dimension of X(cm) and having a lateral dimension of Y (cm).

The plurality of IC chip connecting terminals 41 and the plurality of capacitor connecting terminals 42 are projected from an outermost resin insulating layer 27. These IC chip connecting terminals 41 and capacitor connecting terminals 42 are constituted mainly by copper layers and have the structure such that the upper and side surfaces of these copper layers are covered by plating layers 46 (specifically, nickel-gold plating layers) other than copper.

On the other hand, a plurality of mother board connecting terminals 45 which are the mother board as the object to be connected are arrayed on a lower surface 32 side (a rear plane side of the substrate) of wiring lamination section 30. These mother board connecting terminals 45 are connecting terminals having larger areas than those of IC chip connecting terminals 41 and capacitor connecting terminals 42 at upper surface side 31.

A plurality of openings 37 are formed within an outermost resin insulating layer 20 at a lower surface 32 side of wiring lamination section 30. Mother board connecting terminals 45 corresponding to these plurality of openings 37 are arranged. Specifically, mother board connecting terminals 45 are arranged within respective openings 37 in a state in which a height of a terminal outer surface of each of motor board connecting terminals 45 is lower than a surface of outermost resin insulating layer 20 and an outer peripheral section of the outer surface of each of terminals 45 is covered with outermost resin insulating layer 20. Mother board connecting terminals 45 are mainly composed of copper layers and only the lower surfaces of these copper layers exposed within openings 37 are covered with plating layers 48 other than copper (specifically, nickel-gold plating layers).

Via holes 33 and filled via conductors 34 are disposed within respective resin insulating layers 21 through 27. Respective via conductors 34 have shapes whose diameters are expanded in mutually the same direction (as the diameters are increased from the lower surface side toward the upper surface side as viewed from FIG. 1) so that respective conductor layers 28, IC chip connecting terminals 41, capacitor connecting terminals 42, and mother board connecting terminals 45 are electrically interconnected.

Multilayer wiring substrate 10 described above is, for example, prepared in the following procedure.

First, a support substrate 50 (a glass epoxy substrate or so forth) having a sufficient strength is prepared and resin insulating layers 20 to 27 and conductor layers 28 are build-up on support substrate 50 to form wiring lamination section 30.

Figure 3:
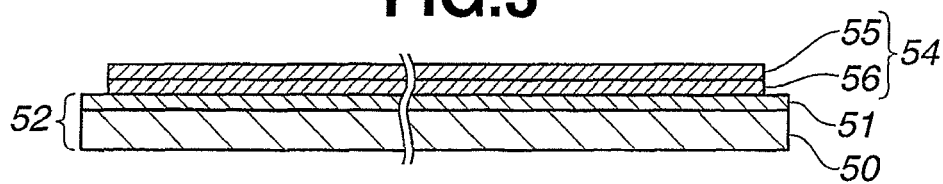
FIG. 3 is an explanatory view representing a method of manufacturing a multilayer wiring substrate in first and third preferred embodiments.

In details, as shown in FIG. 3, a groundwork resin insulating layer 51 is formed by adhering a sheet-like resin insulating base material made of an epoxy resin onto support substrate 50 to obtain a base material 52 constituted by support substrate 50 and groundwork resin insulating layer 51. Then, a laminated layer metal sheet body 54 is arranged on an upper surface of groundwork resin insulating layer 51. As described above, laminated layer metal sheet body 54 is arranged on groundwork resin insulating layer 51 of base material 52. Thus, an arrangement of laminated layer metal sheet body 54 on groundwork resin insulating layer 51 assures an adherence between laminated layer metal sheet body 54 and groundwork resin insulating layer 51 to a degree such that laminated layer metal sheet body 54 is, in the subsequent manufacturing processes, is not exfoliated from groundwork resin insulating layer 51. Laminated layer metal sheet body 54 includes two sheets of copper foils 55, 56, both being in an exfoliation enable state. Specifically, laminated layer metal sheet body 54 is formed on which copper foil 55 and copper foil 56 are arranged via a metal plating (for example, a chromium plating, a nickel plating, a titanium plating, or a composite plating of these metals).

Figure 4:
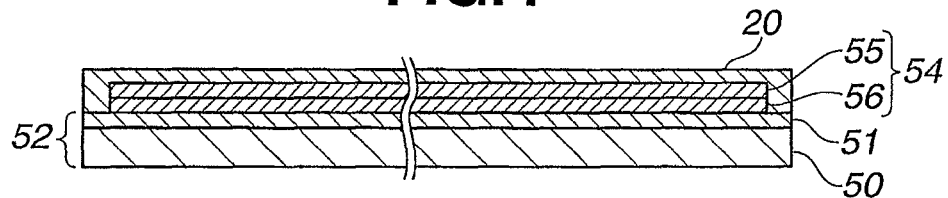
FIG. 4 is an explanatory view representing the method of manufacturing the multilayer wiring substrate in the first and third preferred embodiments.

Next, sheet-like resin insulating layer 20 is arranged to cover laminated layer metal sheet body 54 on base material 52 and sheet-like resin insulating layer 20 is adhered onto base material 52. It should be noted that resin insulating layer 20 is closely adhered to laminated layer metal sheet body 54 and is closely adhered to groundwork resin insulating layer 51 at a surrounding area of laminated layer metal sheet body 54 to hermetically seal laminated layer metal sheet body 54 (refer to FIG. 4). Then, openings 37, to each of which a part of copper foil 55 is exposed, are formed through a laser working using, for example, an Excimer laser, UV laser, $CO_2$ laser, and so forth at predetermined positions of resin insulating layer 20. Thereafter, the electroless copper plating is selectively carried out to form a whole surface plating layer covering openings 37 and resin insulating layer 20.

Figure 5:
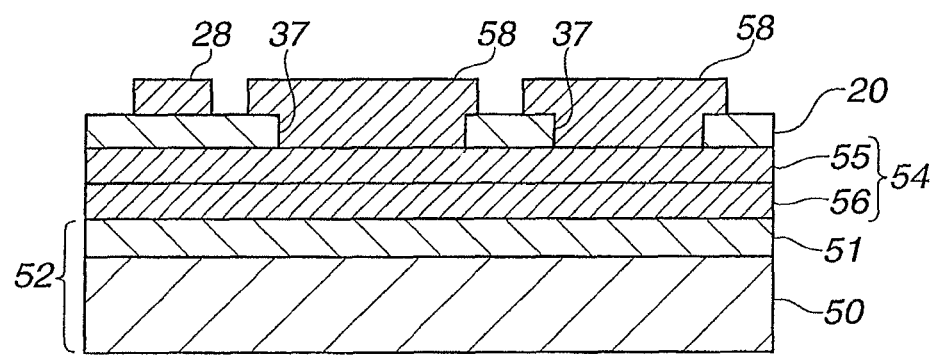
FIG. 5 is an explanatory view representing the method of manufacturing the multilayer wiring substrate in the first and third preferred embodiments.

Thereafter, a plating resist forming purpose dry film is laminated on an upper surface of resin insulating layer 20 and exposure and development are carried out for the same dry film so that a plating resist is formed on outermost resin insulating layer 20. Thereafter, an electrolytic copper plating is selectively carried out in a state in which the plating resist is formed on resin insulating layer 20 so that a metal conductor section 58 is formed on copper foil 55 of laminated layer metal sheet body 54 and one conductor layer 28 is formed on resin insulating layer 20 and, thereafter, the plating resist is exfoliated (refer to FIG. 5). Furthermore, the whole surface plating layer which covers resin insulating layer 20 exposed due to the exfoliation of the plating resist is removed.

It should be noted that sheet-like resin insulating layer 21 is arranged on the upper surface of resin insulating layer 20. Metal conductor section 58 and conductor layer 28 are formed along resin insulating layer 20. Resin insulating layer 21 is, then, adhered onto the upper surface of resin insulating layer 20. Then, via holes 33 are formed at predetermined positions of resin insulating layer 21 (positions at an upper part of metal conductor section 58) by carrying out the laser working using, for example, Excimer laser, UV laser, and $CO_2$ laser. Then, a desmear process to remove a smear within each via hole 33 using an etching solution such as a potassium permanganate solution is carried out. It should be noted that a process for a plasma ashing through, for example, an $O_2$ plasma may be carried out as another process than the process using the etching solution.

Figure 6:
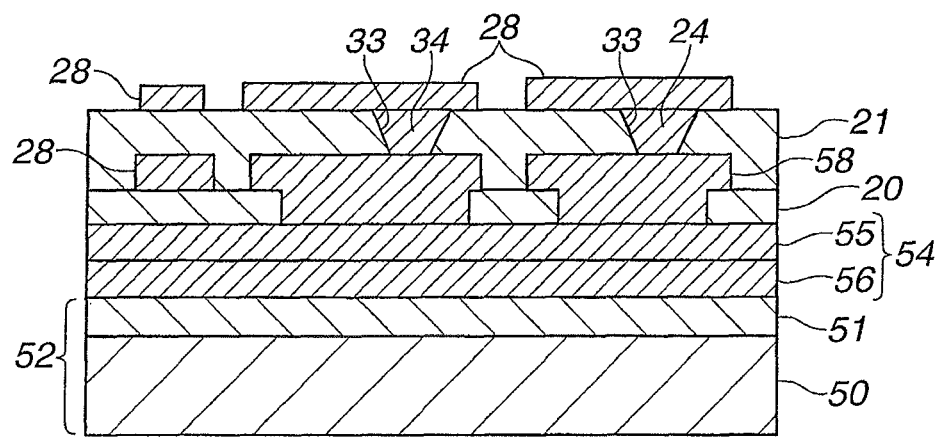
FIG. 6 is an explanatory view representing the method of manufacturing the multilayer wiring substrate in the first and third preferred embodiments.

After the desmear process, the electroless copper plating and the electrolytic copper plating are carried out in accordance with a conventional technique so that via conductor 34 is formed within each via hole 33. Furthermore, the etching is carried out using a well-known technique (for example, a semi-additive process) to make a pattern formation of conductor layer 28 on resin insulating layer 21 (refer to FIG. 6).

Figure 7:
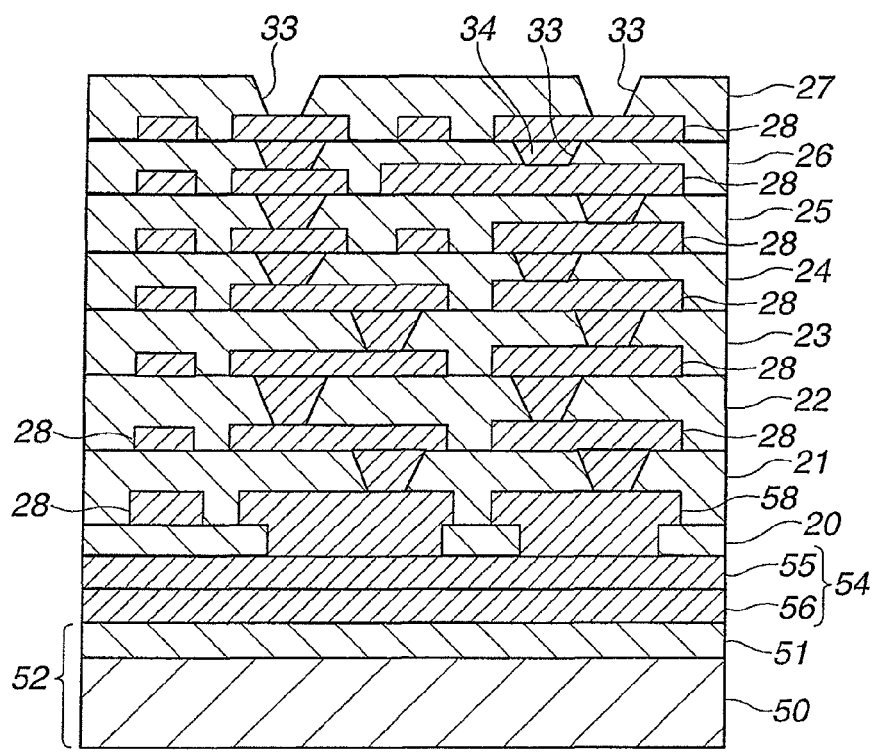
FIG. 7 is an explanatory view representing the method of manufacturing the multilayer wiring substrate in the first and third preferred embodiments.

In addition, other resin insulating layers 22 through 27 and conductor layers 28 are formed in the same technique used for above-described resin insulating layer 21 and conductor layer 28 are laminated over resin insulating layer 21. Then, a laser hole working is carried out for the outermost resin insulating layer 27 to form via holes 33 (refer to FIG. 7). Next, the desmear process to remove the smear within each via hole 33 using the etching solution such as potassium permanganate solution is carried out. Furthermore, the electroless copper plating is carried out to form a whole surface plating layer covering the inside of each via hole 33 of resin insulating layer 27 and resin insulating layer 27.

Figure 8:
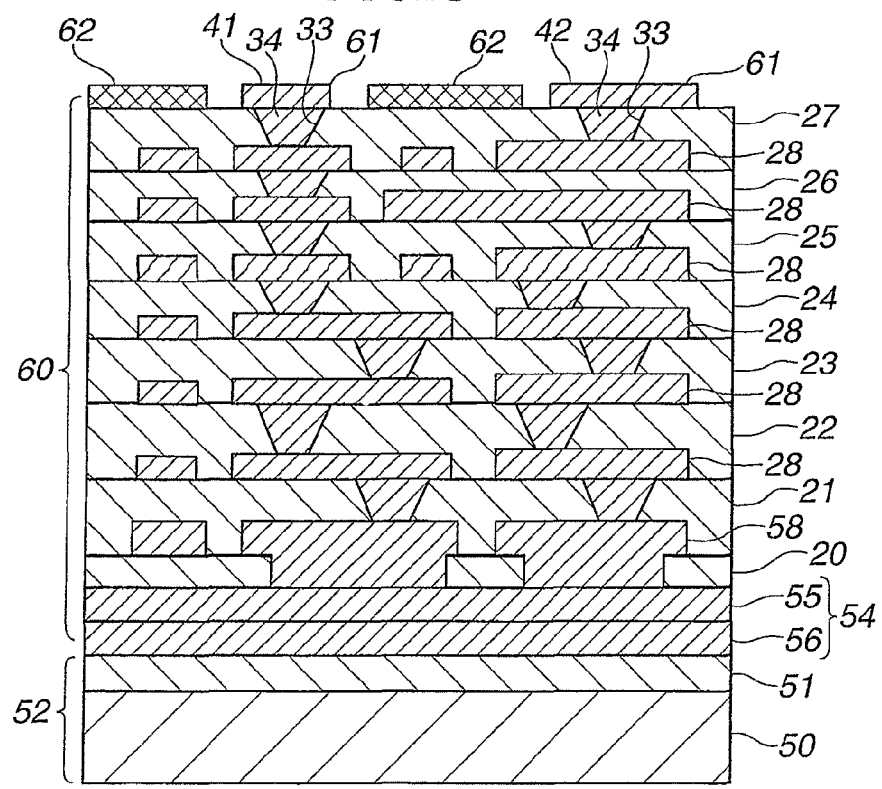
FIG. 8 is an explanatory view representing the method of manufacturing the multilayer wiring substrate in the first preferred embodiment.

Then, the plating resist forming dry film is laminated on the upper surface of resin insulating layer 27 and exposure and development are carried out for the same dry film to form the plating resist on resin insulating layer 27. Thereafter, the electrolytic copper plating is selectively carried out in a state in which the plating resist is formed (the plating layer forming process). Consequently, as shown in FIG. 8, via conductors 34 are formed within respective via holes 33 of resin insulating layer 27 and product plating layers 61 which provide copper layers of IC chip connecting terminals 41 and capacitor connecting terminals 42 are formed on each upper part of via conductors 34. Thereafter, the whole surface plating layer is removed while product plating layers 61 and dummy plating layer 62 are left on the upper surface of resin insulating layer 27. It should be noted that, as IC chip connecting terminals 41, the connecting terminals not connected to the inner side conductor layer are present other than the connecting terminals connected to inner layer side conductor layers. Although FIG. 8 shows only one of IC chip connecting terminals 41 connected to corresponding via conductor 34, any other of IC chip connecting terminals 41 not connected to via conductors 34 are formed in chip mounting region 43 on resin insulating layer 27.

Figure 9:
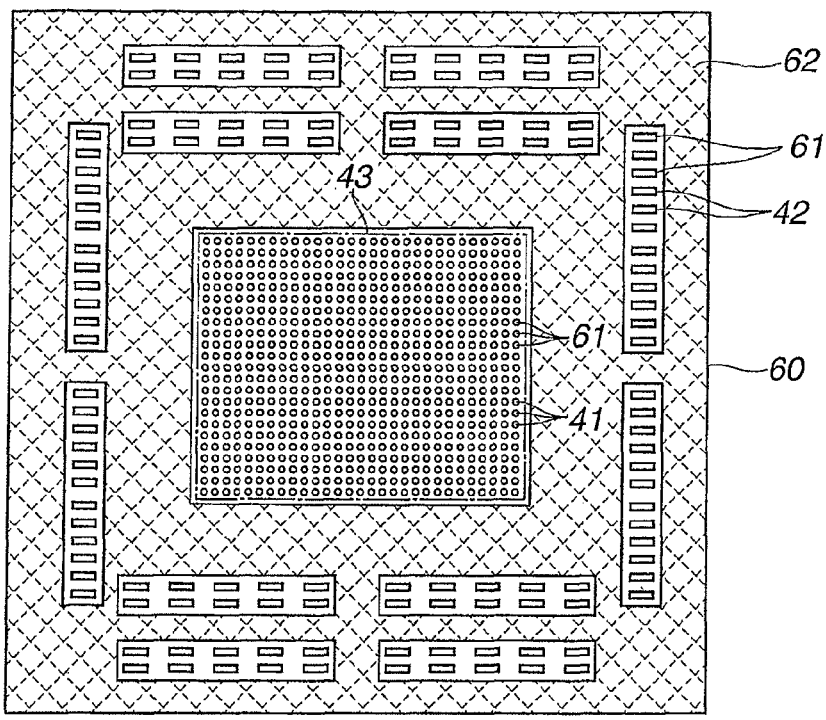
FIG. 9 is an explanatory view representing the method of manufacturing of the multilayer wiring substrate in the first preferred embodiment.

As shown in FIG. 9, dummy plating layer 62 in this embodiment is formed as a conductor layer of a plane shaped pattern (the solid pattern) to cover generally the whole surface except the forming region of IC chip connecting terminals 41 (chip mounting region 43) and the forming region of capacitor connecting terminals 42. It should, herein, be noted that a rate of area of product plating layers 61 to the surface (upper surface 31 which provides the principal plane of the substrate) of resin insulating layer 27 is approximately 7% and dummy plating layer 62 such that a rate of area of the whole plating layer which is an addition of dummy plating layer 62 to product plating layers 61 is equal to or larger than 90% is formed.

A heat treatment to which a hot wind of, for example, 180° C. is added from above the resin surface of outermost resin insulating layer 27 onto this resin surface may be carried out after the above-described plating layer forming process. If this heat treatment is carried out, a color of the resin surface of exposed resin insulating layer 27 is changed. On the other hand, the color of the resin surface of resin insulating layer 27 covered with dummy plating layer 62 is not changed. Hence, for example, if a predetermined pattern shape is provided on dummy plating layer 62, a difference of shades of a color can be developed which accords with the predetermined pattern shape on the resin surface. It should be noted that the heat treatment at this stage also serves to perform an annealing so that there are merits such that resin insulating layer 27 can be hardened and an internal stress applied to each product plating layer 61 can be opened.

When the above-described build-up processes are carried out, a wiring lamination body 60 in which laminated metal sheet body 54, resin insulating layers 20 through 27, conductor layers 28, product plating layers 61, and dummy plating layer 62 are laminated is formed on base material 52.

Figure 10:
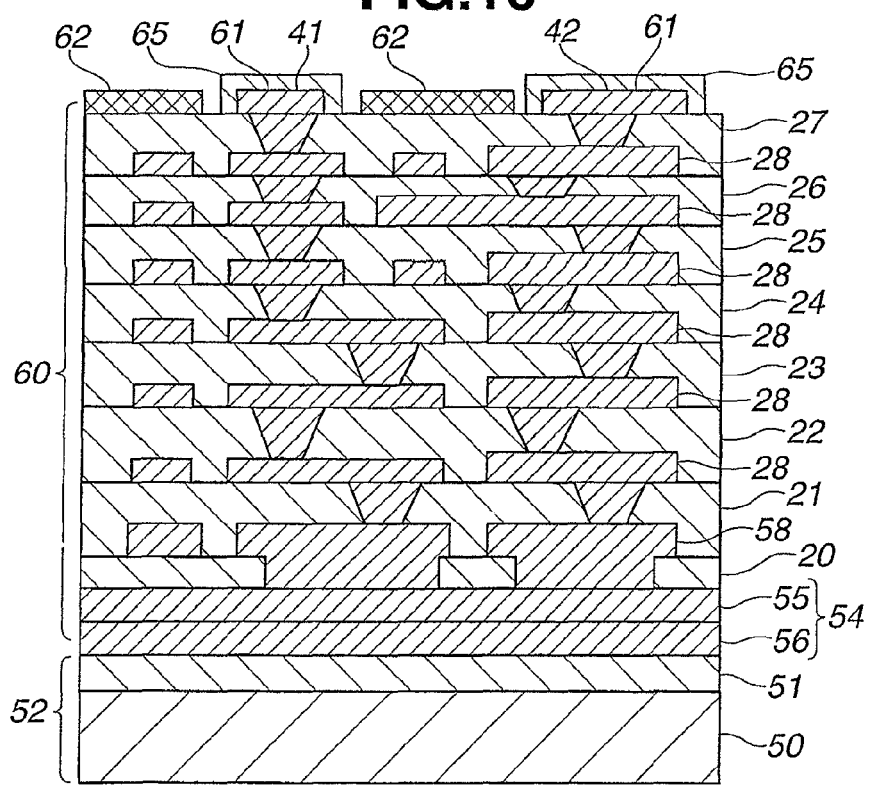
FIG. 10 is an explanatory view representing the method of manufacturing the multilayer wiring substrate in the first preferred embodiment.

Then, the dry film for forming the etching resist is laminated on the upper surface of a wiring lamination body 60 and the exposure and development are carried out for the same dry film and an etching resist 65 (refer to FIG. 10) to cover the surface of each product plating layer 61 is formed (a resist forming process).

After etching resists 65 are formed, wiring lamination body 60 is cut by means of a dicing equipment (not shown) to remove a surrounding area which is a part of wiring lamination section 30. This cut serves to expose an outer edge section of laminated metal sheet body 54 sealed by means of resin insulating layer 20. In other words, the removal of the surrounding area causes a loss of a close adherence section between groundwork resin insulating layer 51 and resin insulating layer 20. Consequently, wiring lamination section 30 and base material 52 are linked via only laminated metal sheet body 54.

Figure 11:
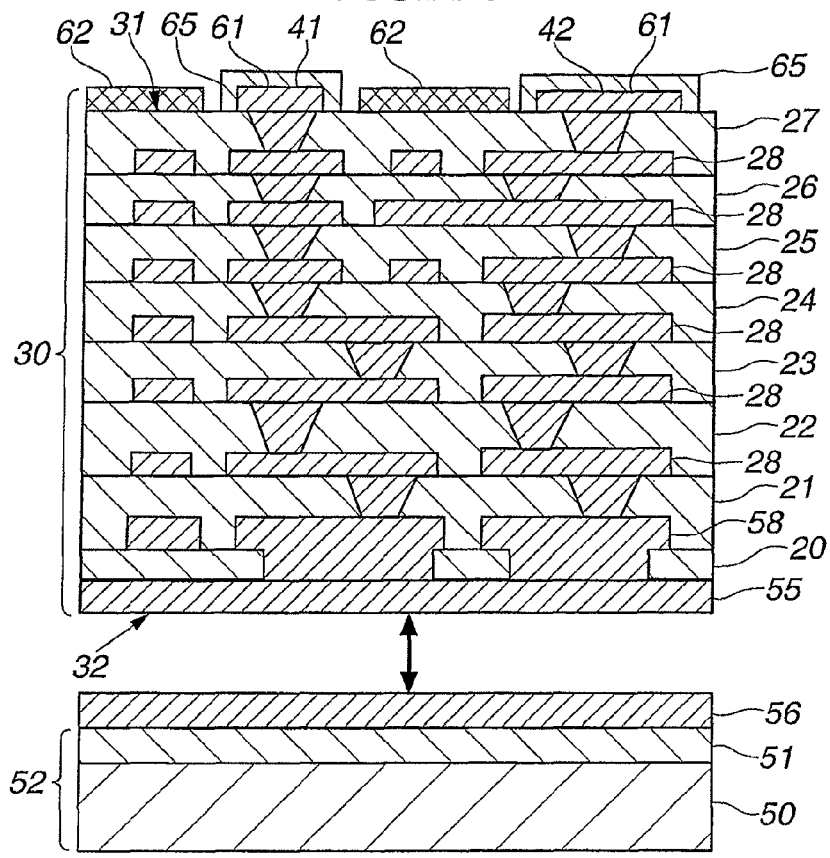
FIG. 11 is an explanatory view representing the method of manufacturing the multilayer wiring substrate in the first preferred embodiment.

It should be noted that, as shown in FIG. 11, base material 52 is removed from wiring lamination section 30 to expose copper foil 55 located on lower surface 32 of wiring lamination section 30 by exfoliating a pair of copper foils 55, 56 through an interface of pair of copper foils 55, 56 in laminated layer metal sheet body 54 (a base material separating process).

Thereafter, the etching is carried out for wiring lamination section 30 to remove dummy plating layer 62 exposed at upper surface 31 side of wiring lamination section 30 (a plating layer removing process).

Figure 12:
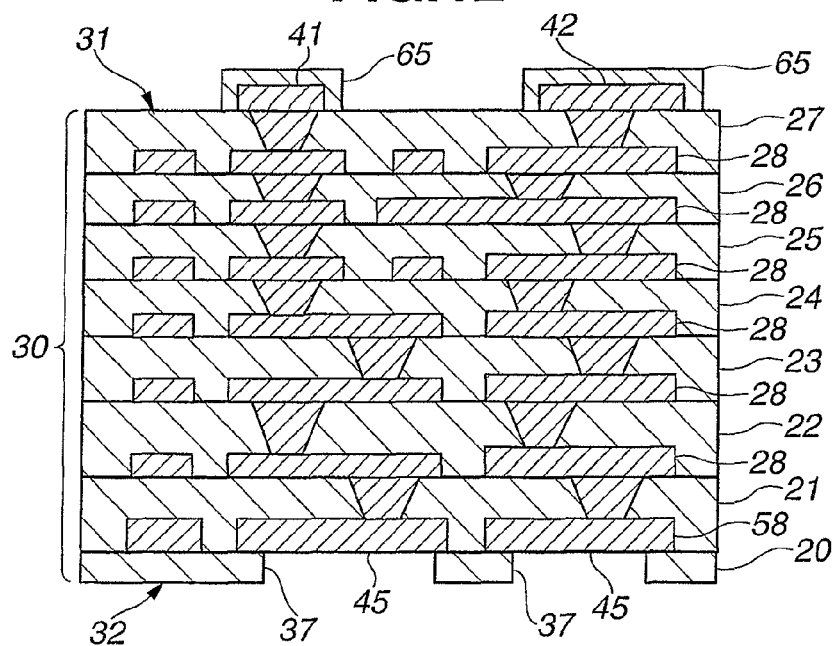
FIG. 12 is an explanatory view representing a manufacturing method of the multilayer wiring substrate in the first preferred embodiment.

In addition, at the same time, copper foil 55 exposed at a lower surface 32 side of wiring lamination section 30 is wholly removed and part of the lower side of metal conductor section 58 is removed. Consequently, each opening 37 is formed within resin insulating layer 20 and metal conductor sections 58 left within openings 37 provide mother board connecting terminals 45 (refer to FIG. 12).

Furthermore, etching resists 65 formed on upper surface 31 of wiring lamination section 30 are removed. Thereafter, an electroless nickel plating and an electroless gold plating are sequentially carried out for the surface of IC chip connecting terminals 41, the surface of capacitor connecting terminals 42, and each surface of mother board connecting terminals 45. Consequently, plating layers 46, 48 are formed on a surface of each connecting terminal 41, 42, and 45. Multilayer wiring substrate 10 shown in FIG. 1 is manufactured by carrying out the above-described processes.

Figure 13:
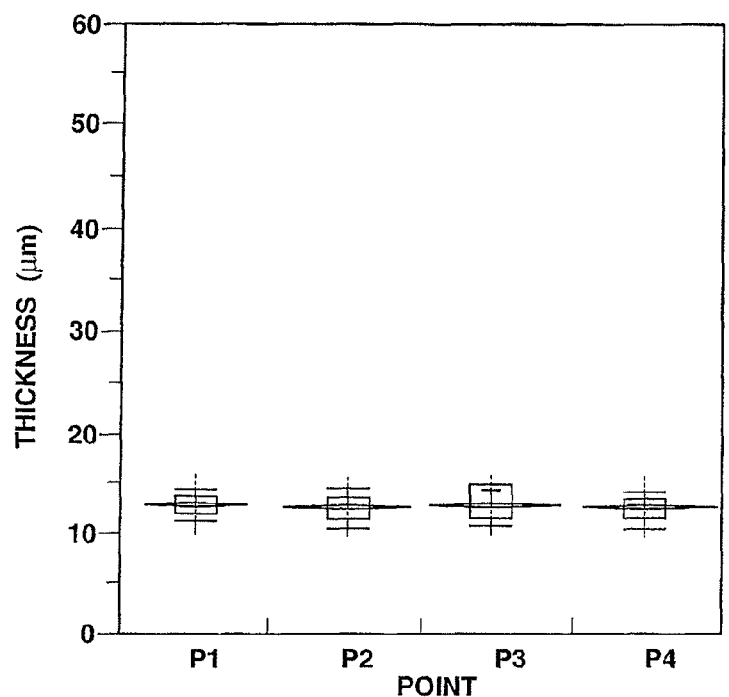
FIG. 13 is a graph representing a result of measurement of a dispersion in a thickness of a product plating layer in the method of manufacturing in the first preferred embodiment.
Figure 14:
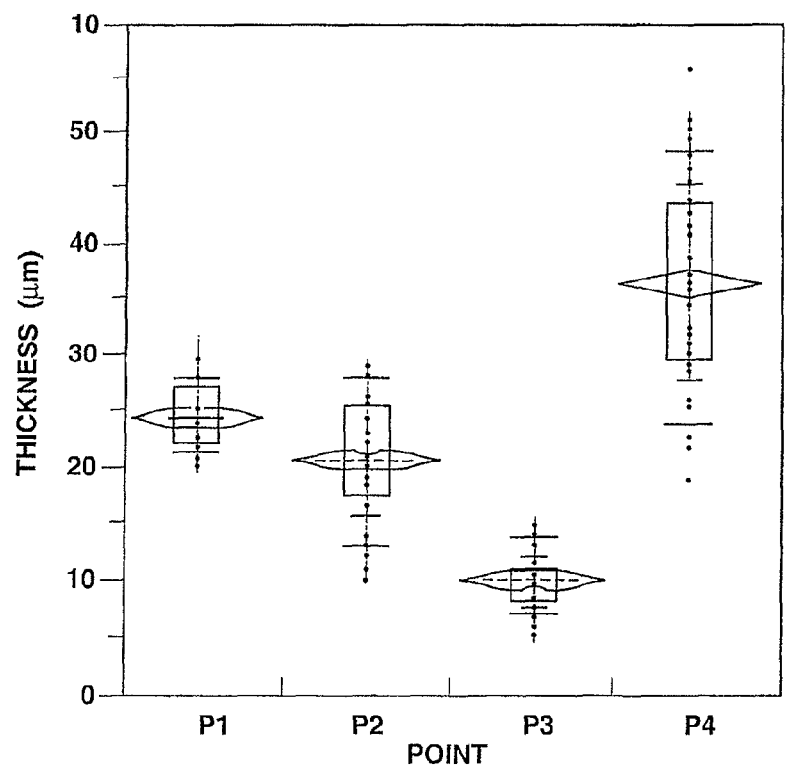
FIG. 14 is a graph representing a result of measurement of the dispersion in a thickness of a product plating layer in the manufacturing method in a manufacturing method of a conventional art.

The inventors measured the dispersion of thickness of each product plating layer 61 at IC chip connecting terminals 41 and capacitor connecting terminals 42 formed on principal plane 31 side of the substrate in multilayer wiring substrate 10 manufactured as described above. This result is shown in FIG. 13. The thickness dispersion of each product plating layer 61 in a case of the conventional manufacturing method by which product plating layers 61 are formed without forming dummy plating layer 62. This result is shown in FIG. 14. It should be noted that the thickness dispersions of four measured locations P1 through P4 were measured, in each of these cases.

Specifically, a first measurement location P1 is a part of product plating layers 61 of IC chip connecting terminals 41 not connected to via conductor 34 on an outer peripheral section of chip mounting region 43 and a second measurement location P2 is a part of product plating layers 61 of IC chip connecting terminals 41 connected to via conductor 34 on the outer peripheral section of chip mounting region 43. In addition, a three measurement location P3 is a part of product plating layers 61 of IC chip connecting terminals 41 connected to via conductor 34 located at a center section of chip mounting region 43. A fourth measurement location P4 is a part of product plating layers 61 of capacitor connecting terminals 42. It should be noted that, in a case of measurement locations P1 through P3, the thickness dispersion was measured for product plating layers 61 of 60 numbers of IC chip connecting terminals 41. In addition, the thickness dispersion was measured for 48 numbers of capacitor connecting terminals 42 in a case of the fourth measurement location.

As shown in FIG. 14, since dummy plating layer 62 is not formed in the conventional manufacturing method, the thickness dispersion of each product plating layer 61 became large. Specifically, an average value of a plate thickness of first measurement location P1 was 24.72 m. A standard deviation was 2.50. An average value of the plate thickness of second measurement location P2 was 20.99 μm and standard deviation was 5.20. The average value of the plate thickness of third measurement location P3 was 10. 08 μm and standard deviation was 2.31. The average value of the plate thickness of fourth measurement location P4 was 36.58 μm and the standard deviation was 8.92.

As described above, the thickness dispersion is developed in accordance with each product plating layer 61 (measurement locations P1 through P3) which provides the IC chip connecting terminals 41 in accordance with a presence or absence of via conductor 34 to be connected and a forming position thereof. In addition, an outer peripheral side of the principal plane of the substrate is dotted with product plating layers 61 (measurement location P4) which provide capacitor connecting terminal 42. Thus, a current concentration is apt to occur. Therefore, the plate thickness of product plating layers 61 becomes relatively thicker and the dispersion of the thickness becomes accordingly increased.

On the other hand, as shown in FIG. 13, in the manufacturing method in the preferred embodiment, a thickness dispersion of each product plating layer 61 became small. Specifically, an average value of the plate thickness of first measurement location P1 was 12.85 μm and the standard deviation was 1.16. An average value of the plate thickness of second measurement location P2 was 12.51 μm and the standard deviation was 1.53. The average value of the plate thickness of third measurement location P3 was 12.90 μm and the standard deviation was 1.47. The average value of the plate thickness of fourth measurement location P4 was 12.51 μm and the standard deviation was 1.21. In this way, dummy plating layer 62 was disposed at the surroundings of product plating layers 61 to enable a suppression of the thickness dispersion of product plating layer 61.

Furthermore, the inventors performed the following to investigate a relationship between a size of IC chip mounting region 43 and the thickness dispersion of product plating layers 61. The dimension of IC chip mounting region 43 was modified (namely, values of X, Y were modified) and several multilayer wiring substrates 10 were prepared in the manufacturing method in the first preferred embodiment. It should be noted that a design value of thickness of product plating layers 61 in the IC chip connecting terminals 41 formed on the principal plane 31 side of the substrate was Z (μm). More specifically, product plating layers 61 were formed, setting Z=15 μm. In addition, the rate of area of dummy plating layer 62 occupied in the dummy plating layer forming region was set in a range between 30% and 100% and the distance between each product plating layers 61 and dummy plating layer 62 was set in the range between 0.1 mm and 10 mm. The thickness (μm) of product plating layers 61 was measured from five points of the corner sections and the center section of IC chip mounting region 43. Then, standard deviation σ(μm) of actual values of thickness of product plating layers 61 was determined. The results of this were shown in a graph of FIG. 15. Incidentally, in the graph shown in FIG. 15, a longitudinal axis thereof denotes standard deviation σ and a lateral axis thereof denotes a length of a half diagonal of an IC chip mounting region 43 (a spacing distance between each of the corner sections and the center section of IC chip mounting region 43).

Figure 15:
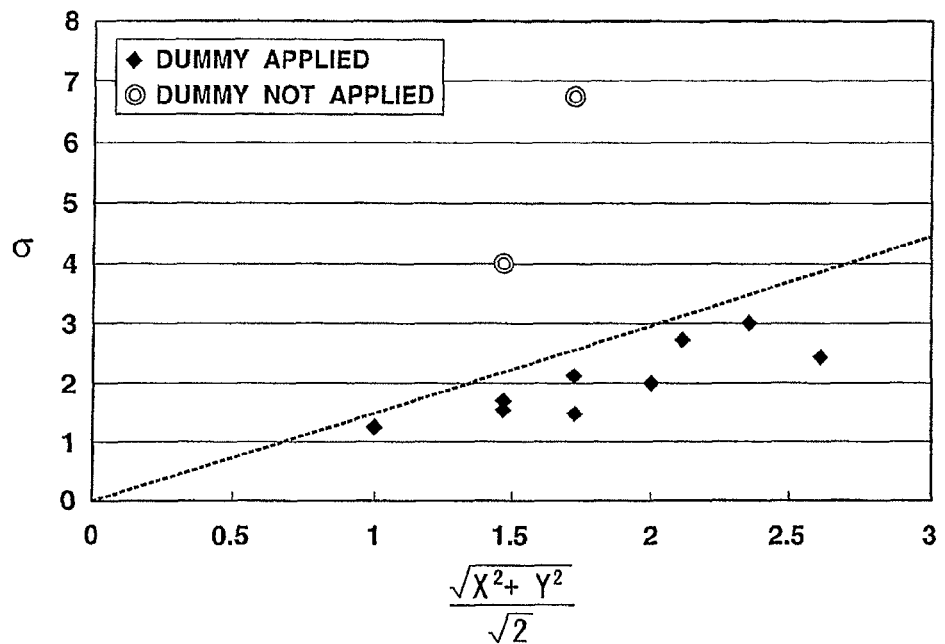
FIG. 15 is a graph representing a relationship between a size of an IC chip mounting region and a dispersion of the thickness of the product plating layer in each of the manufacturing method in the first embodiment and the conventional manufacturing method.

It was revealed that, as shown in FIG. 15, in multilayer wiring substrate 10 manufactured by the manufacturing method in the first embodiment, the value of standard deviation σ satisfies the following relationship, irrespective of a size of IC chip mounting region 43.

$$\sigma \leq 1.5 \times (Z/15) \times \left(\frac{\sqrt{X^2 + Y^2}}{\sqrt{2}}\right)$$

On the other hand, several multilayer wiring substrates 10 were prepared using the conventional manufacturing method in which only product plating layers 61 are formed without forming dummy plating layer 62. Then, in the similar method, thickness (μm) of product plating layers 61 is measured from five points of the corner section and the center section of IC chip mounting region 43 to derive standard deviation σ (m) of the actually measured value of the thicknesses of product plating layers 61. The result of this is shown in the graph of FIG. 15. Thus, it was determined that, in the case of the conventional manufacturing method, the value of standard deviation σ was apparently increased and the dispersion of the thickness was increased. Hence, these do not satisfy the above-described relationship.

Therefore, the following effects can be obtained in the case of the first preferred embodiment according to the first feature of the present invention.

(1) In the first embodiment, on upper surface 31 of multilayer wiring substrate 10, dummy plating layer 62 is formed on the surroundings of product plating layers 61 in addition to product plating layers 61 which provide IC chip connecting terminals 41 and capacitor connecting terminals 42. In this case, the rate of area of plating layers 61, 62 on upper surface 31 of multilayer wiring substrate 10 can be increased so that the concentration of the plating current can be avoided and the dispersion of the thickness of each product plating layers 61 can be eliminated. Consequently, the plurality of IC chip connecting terminals 41 and the plurality of capacitor connecting terminals 42 can be formed with the uniform thickness. Hence, if multilayer wiring substrate 10 is used, connection reliabilities between IC chip and IC chip connecting terminals 41 and between the chip capacitors and capacitor connecting terminals 42 can be improved.

(2) In the first embodiment, the etching resist is formed so as to cover product plating layers 61, in the etching resist forming process, and, thereafter, the dummy plating layer is removed through the etching in the plating layer removing process. In this case, only product plating layers 61 which provide respective connecting terminals 41, 42 are left on the upper surface of multilayer wiring substrate 10. Therefore, a formation of plating layers 46 to improve a solder wettability only on the surfaces of product plating layers 61 can be assured. In addition, since dummy plating layer 62 is removed, such a problem that the IC chip and the chip capacitors are erroneously connected to dummy plating layer 62 can be avoided.

(3) In the first embodiment, the plating layer removing process is carried out after the base material separating process. In this case, at the same time when dummy plating layer 62 on upper surface 31 side of multilayer wiring substrate 10 is removed through the etching, copper foil 55 located on lower surface 32 side can be removed through the etching. Hence, multilayer wiring substrate 10 can be manufactured at the same labor hour as the conventional manufacturing method and the manufacturing cost can be suppressed to be low.

(4) In this embodiment, the rate of areas of product plating layers 61 which provide IC chip connecting terminals 41 and capacitor connecting terminals 42 to upper surface 31 of resin insulating layer 27 is about 7% and the rate of areas of product plating layers 61 is relatively small. Therefore, dummy plating layer 62 is formed so that the rate of area of product plating layers 61 on upper surface 31 of resin insulating layer 27 is equal to or larger than 90%. In this case, dummy plating layer 62 is disposed so that the rate of area of dummy plating layer 62 is ten times equal to or larger than that of product plating layers 61. Thus, the concentration of the plating current can assuredly be avoided and product plating layers 61 on respective connecting terminals 41, 42 can be formed with the uniform thickness.

[Second Preferred Embodiment]

Figure 16:
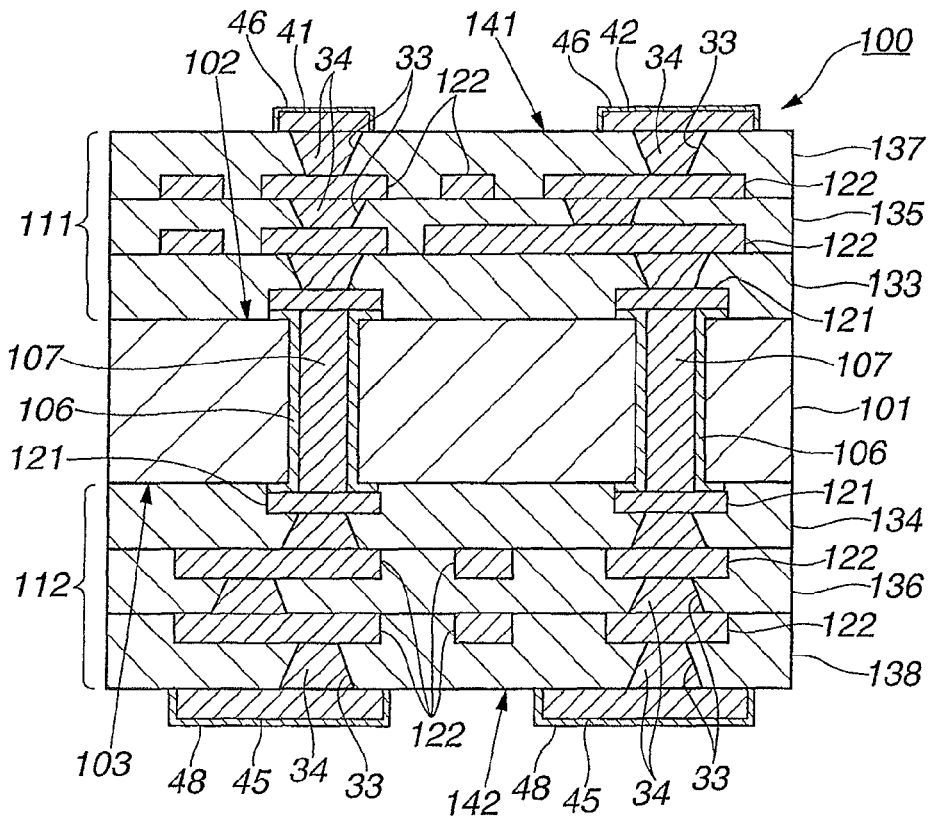
FIG. 16 is a cross sectional view representing a rough configuration of the multilayer wiring substrate in a second preferred embodiment.

Hereinafter, a second preferred embodiment which embodies the first feature of the present invention to the multilayer wiring substrate will be described on a basis of the attached drawings. FIG. 16 shows an expanded cross sectional view representing a rough configuration of the multilayer wiring substrate in a second embodiment. In the first embodiment, the present invention is embodied to the coreless wiring substrate but, in the second embodiment, the present invention is embodied to the multilayer wiring substrate having the core substrate.

As shown in FIG. 16, a multilayer wiring substrate 100 in this embodiment includes: a core substrate 101 in a rectangular plate form; a first build-up layer 111 formed on a core principal plane 102 of core substrate 101; and a second build-up layer 112 formed on a core rear plane 103 of core substrate 101.

Core substrate 101 in the second embodiment is constituted by a resin insulating material (a glass epoxy material) in which the epoxy resin is impregnated in, for example, a glass cloth as a reinforcement member. A plurality of through-hole conductors 106 are penetrated through core principal plane 102 and core rear plane 103. An inside of each through-hole conductor 106, for example, is filled with a closure body 107 made of, for example, an epoxy resin or so forth. Conductor layers 121, each conductor layer being made of copper, are pattern formed on core principal plane 102 and core rear plane 103 of core substrate 101 and each conductor layer 121 is electrically connected to a through-hole conductor 106.

First build-up layer 111 formed on core principal plane 102 of core substrate 101 has a structure such that three resin insulating layers 133, 135, 137, each resin insulating layer being made of a thermosetting resin (epoxy resin), and conductor layers 122, each conductor layer being made of copper, are alternatively laminated. A plurality of IC chip connecting terminals 41 (chip component connecting terminals) are arrayed at the center section of the substrate in the same way as the above-described first preferred embodiment, on upper surface 141 (the principal plane of substrate) of outermost resin insulating layer 137. In addition, a plurality of capacitor connecting terminals (chip component connecting terminals) 42 are arranged at a side of core substrate 101 outer than IC chip connecting terminals 41. These IC chip connecting terminals 41 and capacitor connecting terminals 42 are mainly constituted by copper layers and plating layers 46 cover the upper surface and side surface of these copper layers. Via holes 33 and via conductors 34 are also formed within resin insulating layers 133, 135, and 137. Respective via conductors 34 are electrically connected to conductor layers 121, 122 and respective connecting terminals 41, 42.

A second build-up layer 112 formed on core rear plane 103 of core substrate 101 has approximately the same structure as first build-up layer 111 described above. That is to say, second build-up layer 112 formed on a rear plane 103 of core substrate 101 has the structure such that three resin insulating layers 134, 136, 138 and conductor layers 122 are alternatively laminated. A plurality of mother board connecting terminals 45 are formed on a lower surface 142 (the rear plane of the substrate) of outermost resin insulating layer 138. These mother board connecting terminals 45 are constituted mainly by the copper layers and have the structure such that the lower and side surfaces of the respective copper layers are covered by plating layers 48. In addition, via holes 33 and via conductors 34 are formed within resin insulating layers 134, 136, 138. Respective via conductors 34 are electrically connected to conductor layers 121, 122 and connecting terminals 45.

Next, a method of manufacturing multilayer wiring substrate 100 in the second embodiment according to the present invention will be described below.

First, a copper clad laminated plate is prepared in which the copper foil is pasted on each of both surfaces of the base material constituted by the glass epoxy. Then, a drilling is carried out using a drilling machine so that penetrating holes (not shown) which penetrate through front and rear planes of the copper clad laminated plate is previously formed at predetermined positions. Thus, the electroless copper plating and electrolytic copper plating are carried out for the inner surfaces of the penetrating holes of the copper clad laminated plate and through-hole conductors 106 are formed within the penetrating holes. Thereafter, a cavity portion of each through-hole conductor 106 is filled with an insulating resin material (epoxy resin) to form closure body 107.

Figure 17:
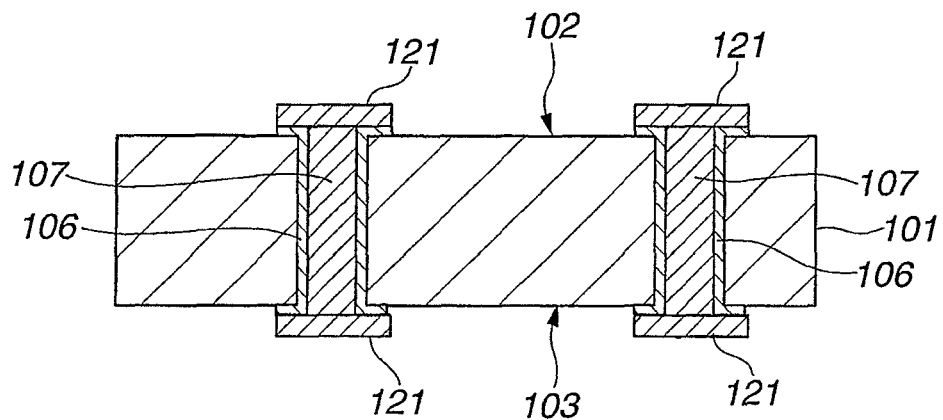
FIG. 17 is an explanatory view representing the method of manufacturing the multilayer wiring substrate in second and fourth preferred embodiments.

Furthermore, the electroless copper plating and the electrolytic copper plating are carried out to form a copper plating layer on a surface of the copper clad laminated plate, the surface including the exposed part of closure body 107. Thereafter, this copper plating layer and the copper foil are, for example, patterned through the subtractive process. Consequently, core substrate 101 is obtained in which conductor layers 121 and through-hole conductors 106 are formed, as shown in FIG. 17.

Figure 18:
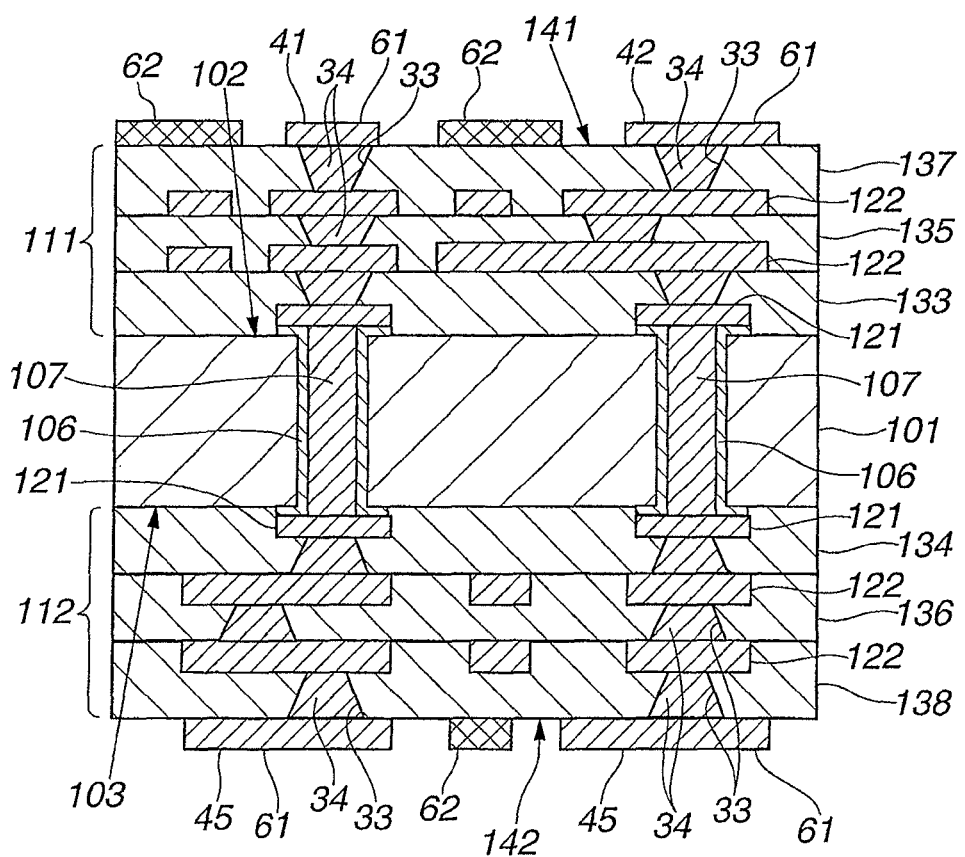
FIG. 18 is an explanatory view representing the method of manufacturing the multilayer wiring substrate in the second preferred embodiment.

Then, the build-up process in the same way as the above-described first embodiment is carried out so that first build-up layer 111 is formed on core principal plane 102 of core substrate 101 and second build-up layer 112 is formed on core rear plane 103 of core substrate 101. At this time, product plating layers 61 providing respective connecting terminals 41, 42 are formed and dummy plating layer 62 is formed at the surrounding of corresponding product plating layers 61, on upper surface 141 of the outermost layer of first build-up layer 111 (refer to FIG. 18). In addition, in this process, product plating layers 61 which provide mother board connecting terminals 45 are formed and dummy plating layer 62 is formed at the surroundings of product plating layers 61, on the lower surface of resin insulating layer 138 which is the outermost layer of second build-up layer 112 (refer to FIG. 18).

Figure 19:
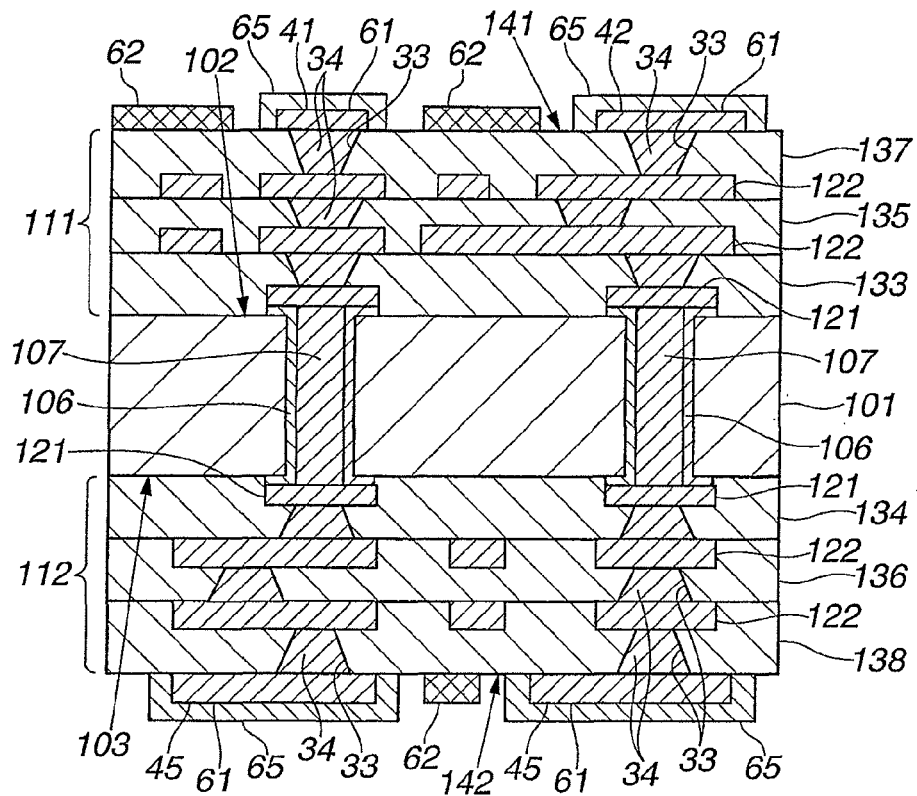
FIG. 19 is an explanatory view representing the method of manufacturing the multilayer wiring substrate in the second preferred embodiment.

Thereafter, a dry film for forming the etching resist is laminated on a surface (upper surface 141 of resin insulating layer 137) of first build-up layer 111 and the exposure and development are carried out for the same dry film and etching resists 65 which cover the surfaces of product plating layers 61 (refer to FIG. 19) are formed. Furthermore, the dry film for forming the etching resist is laminated on the surface of second build-up layer 112 (lower surface 142 of resin insulating layer 138), and the exposure and development are carried out for the same dry film so that etching resists 65 which cover the surfaces of product plating layers 61 are formed (refer to FIG. 19).

The etching is carried out after etching resists 65 are formed so that dummy plating layer 62 exposed to surfaces of respective build-up layers 111, 112 and, thereafter, etching resists 65 are removed. Electroless nickel plating and electroless gold plating are sequentially carried out for the surface of IC chip connecting terminals 41, the surface of capacitor connecting terminals 42, and the surface of mother board connecting terminals 45. Consequently, plating layers 46, 48 are formed on surfaces of respective connecting terminals 41, 42, and 45. Multilayer wiring substrate 100 shown in FIG. 16 is manufactured by carrying out the above-described processes.

Hence, the following effects can be obtained in the second embodiment according to the first feature of the present invention.

(1) Even in the second embodiment, dummy plating layer 62 is formed at the surroundings of product plating layers 61 in addition to product plating layers 61 which provide IC chip connecting terminals 41 and capacitor connecting terminals 42, on the upper surface 141 of resin insulating layer 137. In this case, the rate of areas of plating layers 61, 62 in resin insulating layer 137 to upper surface 141 of resin insulating layer 137 can be increased so that the concentration of plating current can be avoided and the dispersion of thickness of product plating layers 61 can be eliminated. Consequently, the plurality of IC chip connecting terminals 41 and the plurality of capacitor connecting terminals 42 can be formed with the uniform thickness. Hence, if multilayer wiring substrate 100 is used, the connection reliabilities between chip components of IC chip and chip capacitors and respectively corresponding connecting terminals can be improved.

(2) In the second embodiment, on lower surface 142 of resin insulating layer 138, dummy plating layer 62 is formed at the surroundings of product plating layers 61 which provide mother board connecting terminals 45. Thus, the concentration of the plating current can be avoided and the thickness dispersion of product plating layers 61 of respective connecting terminals 41 can be suppressed. Consequently, in multilayer wiring substrate 100, the plurality of mother board connecting terminals 45 can be formed with the uniform thickness and the connection reliability with mother board connecting terminals 45 can be improved.

It should be noted that the first and second embodiments according to the present invention may be modified as follows:

In each of the first and second embodiments, dummy plating layer 62 is removed through the etching. However, multilayer wiring substrate 10, 100 may be completed in a state in which dummy plating layer 62 is left. In this case, since dummy plating layer 62 is not electrically connected to inner side conductor layers 28, 122, an electrical performance of multilayer wiring substrate 10, 100 is not worsened even if dummy plating layer 62 is present. In addition, since multilayer wiring substrate 10, 100 are constituted by dummy plating layer 62 of a relatively wide area, a heat dissipation can be increased. Furthermore, in multilayer wiring substrate 10 having no core such as multilayer wiring substrate 10 in the first embodiment, a substrate strength becomes weak but, if dummy plating layer 62 is disposed, the substrate strength can be increased. Consequently, a warp of multilayer wiring substrate 10 can be suppressed.

In each of the preferred embodiments, dummy plating layer 62 is formed at the surroundings of product plating layers 61 which provide capacitor connecting terminals 42 in addition to product plating layers 61 which provide IC chip connecting terminals 41, on upper surfaces 31, 141 of multilayer wiring substrate 10, 100. The present invention is, however, not limited to this. For example, it is possible to connect the chip capacitors to capacitor connecting terminals 42 even if the thickness dispersion of capacitor connecting terminals 42 is present and the thickness dispersion of the connecting terminals provides a major problem for IC chip connecting terminals 41 rather than capacitor connecting terminals 42. Hence, since, in the plating layer forming process, dummy plating layer 62 is formed on only the surroundings of product plating layers 61 which provide IC chip connecting terminals 41 and dummy plating layer 62 is not formed on the surrounding of product playing layers 61 which provide capacitor connecting terminals 42. Even if the dummy plating layer is formed in the way as described above, the thickness dispersion of IC chip connecting terminals 41 can be suppressed and the connection reliability of IC chip connecting terminals 41 to the IC chip can sufficiently be secured.

In each of the above-described embodiments, dummy plating layer 62 formed in the plating layer forming process is the solid pattern having no mesh. However, the present invention is not limited to this. For example, plane shaped dummy plating layer 62 having the meshes may be formed. In this way, since dummy plating layers 62 in the plane shape and having the meshes is formed, the rate of areas of the plating layers can accurately be adjusted.

In each of the first and second embodiments described above, respective connecting terminals 41, 42 are formed having the same thicknesses (thickness about 10 μm) as inner side conductor layers 28, 122. However, the present invention is not limited to this. For example, post-shaped connecting terminals (post electrodes), each having the thickness thicker than each of conductor layers 28, 122 at the inner layer sides and having a post shaped electrode with, for example, a thickness equal to or thicker than, for example, 30 μm, may be formed. As described above, even in a case where relatively thick connecting terminals as described above are formed, dummy plating layer 62 is formed so that the respective connecting terminals can be formed with the uniform thickness.

Next, technical ideas grasped by the respective embodiments described hereinbefore are listed below in addition to the technical ideas described in the claims.

(1) The method of manufacturing the multilayer wiring substrate as set forth in means 1, wherein the plurality of IC chip connecting terminals to which the IC chip is connectable and the plurality of chip capacitor connecting terminals to which the chip capacitors are connectable are disposed on the principal plane of the substrate, both of IC chip connecting terminals and chip capacitor connecting terminals constituting the chip component connecting terminals.

(2) The method of manufacturing the multilayer wiring substrate as set forth in means 1, wherein the dummy plating layer is a plane shaped pattern.

(3) The method of manufacturing the multilayer wiring substrate as set forth in means 1, wherein the dummy plating layer has a plane shaped pattern having meshes.

(4) The method of manufacturing the multilayer wiring substrate as set forth in means 1, wherein the dummy plating layer has a pattern corresponding to a form and a size of an adjacent one of the product plating layers.

(5) The method of manufacturing the multilayer wiring substrate as set forth in means 1, wherein, in the plating layer forming process, a filled via connected between the inner layer side conductor layer and chip component connecting terminals is formed at the same time as the plating layers.

(6) The method of manufacturing the multilayer wiring substrate as set forth in means 1, wherein, in the plating layer forming process, the dummy plating layer is formed such that a rate of area of the dummy plating layer is larger than the product plating layers by 10 times or more.

(7) The method of manufacturing the multilayer wiring substrate as set forth in means 1, wherein both of the product plating layers and the dummy plating layer are formed through a copper plating.

(8) The method of manufacturing the multiplayer wiring substrate as set forth in means 1, wherein each of the resin insulating layers is formed using a build-up material mainly constituted by a thermosetting resin.

Embodiments to carry out a second feature according to the present invention

[Third Embodiment]

Figure 20:
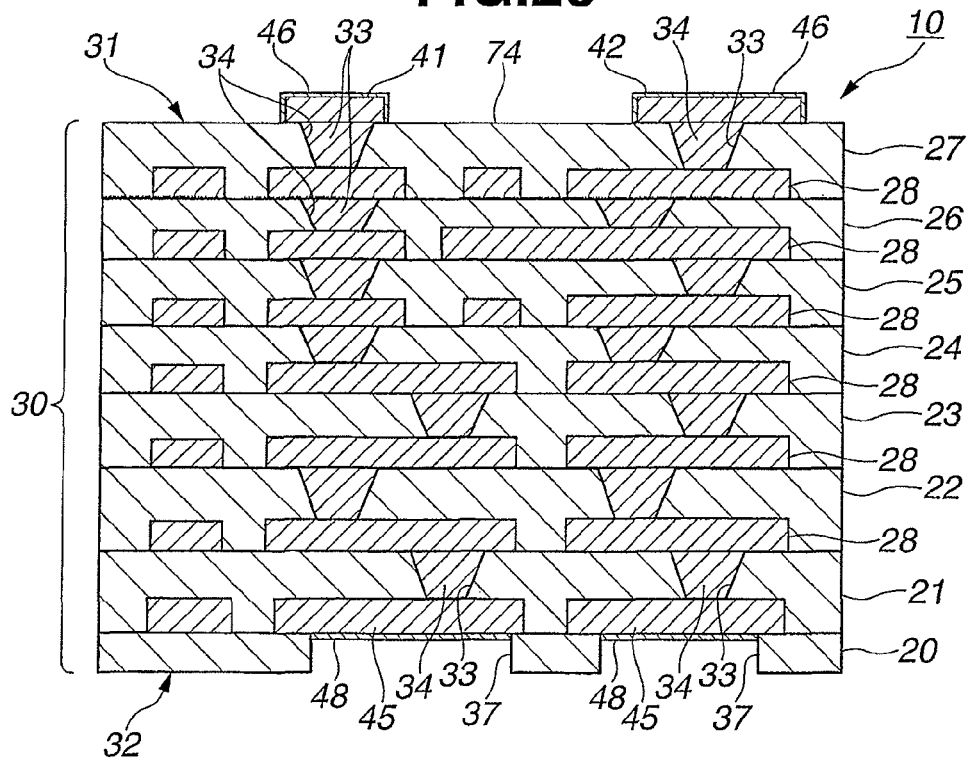
FIG. 20 is a cross sectional view representing a rough configuration of the multilayer wiring substrate in a third preferred embodiment.
Figure 21:
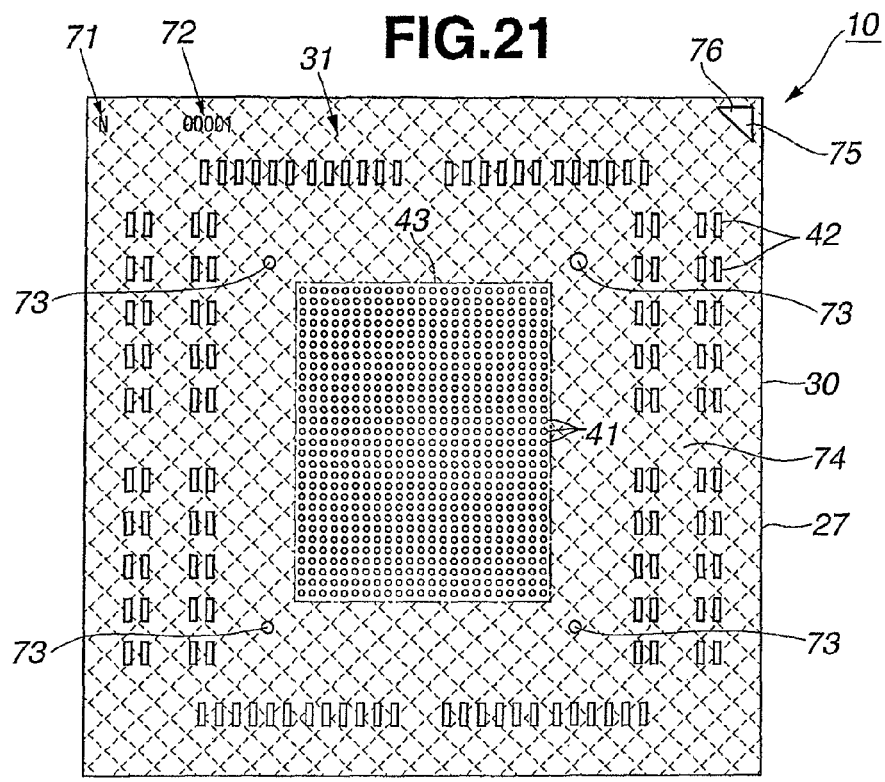
FIG. 21 is a plan view representing the rough configuration of the multilayer wiring substrate in the third embodiment.

A third preferred embodiment which embodies the second feature according to the present invention will be described in details on a basis of the attached drawings. FIG. 20 is an expanded cross sectional view representing a rough configuration of the multilayer wiring substrate in the third preferred embodiment. FIG. 21 is a plan view of the multilayer wiring substrate viewed from the upper surface side As shown in FIGS. 20 and 21, multilayer wiring substrate 10 in the third preferred embodiment is the coreless wiring substrate formed so as not to include the core substrate.

The basic structure and the preparation procedure on this multilayer wiring substrate are the same as those of the first preferred embodiment. Hence, the structure and the preparation procedure which are different only from the first embodiment will, hereinafter, be described.

As shown in FIG. 21, in multilayer wiring substrate 10, outermost resin insulating layer 27 exposed onto upper surface 31 side is provided with recognition marks 71, 72, and 73 which are formed according to a difference in shades of a color of the resin surface. In this embodiment, a letter mark 71 representing company's name and a numeral mark 72 representing a product number, as recognition marks, are formed on an outer edge section (a left upper outer edge section in FIG. 21) and marks 73 for determining the position of the IC chip is formed in the vicinity to the corner sections of chip mounting region 43. Furthermore, outermost resin insulating layer 27 is provided with a pattern 74 formed according to the difference of the shades of the color and whose reticulated pattern is regularly aligned. This pattern 74 is formed on an almost whole surface of outermost resin insulating layer 27 exposed onto upper surface 31 side.

In addition, a positioning mark 76 is disposed on multilayer wiring substrate 10 through which conductor section 75 is exposed at a corner section of the substrate which provides an outer edge section of upper surface side 31 (a corner located on a right upper part of the substrate in FIG. 21). In this embodiment, conductor section 75 of positioning mark 76 is formed by carrying out the plating on outermost resin insulating layer 27 and positioning mark 76 is recognized by detecting a difference in an optical reflectance between the resin surface of outermost resin insulating layer 27 and the surface of conductor section 75 through a detecting apparatus not shown.

As described above, an exemplary preparation procedure of multilayer wiring substrate 10 is basically the same as the first preferred embodiment. Hence, only the exemplary preparation procedure different from the first embodiment will be described below.

Figure 22:
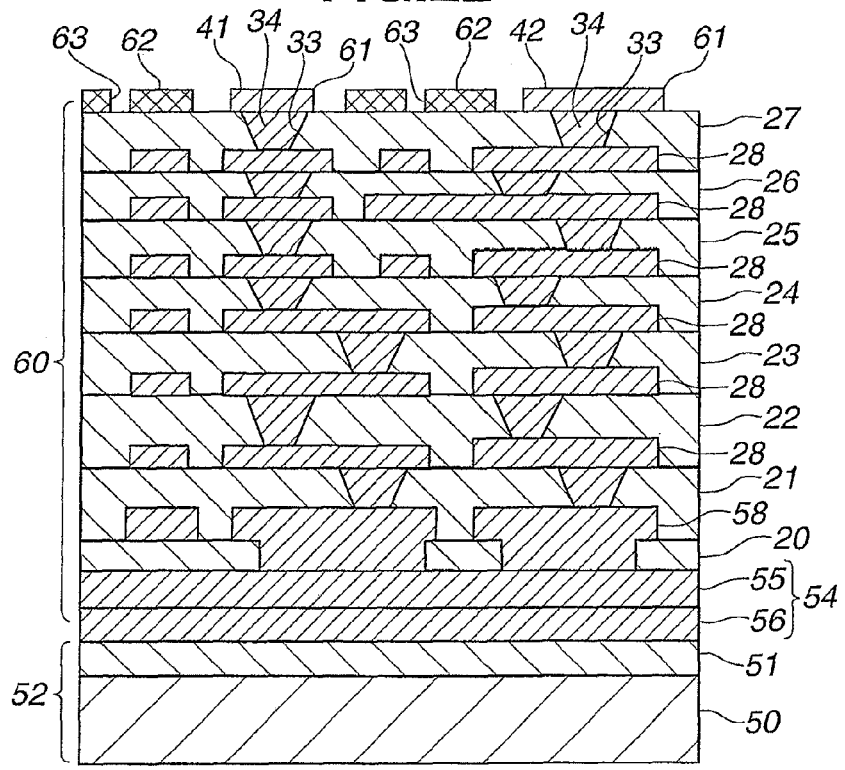
FIG. 22 is an explanatory view representing the method of manufacturing the multilayer wiring substrate in the third preferred embodiment.

The same procedure as the first embodiment is carried out up to the plating layer forming process. Consequently, as shown in FIG. 22, via conductors 34 are formed within via holes 33 of resin insulating layer 27. Product plating layers 61 are formed on the upper part of via conductors 34 to provide copper layers of IC chip connecting terminals 41 and capacitor connecting terminals 42. In addition, product plating layer 61 is formed which provides conductor section 75 for positioning mark 76 at the position of the corresponding corner portion of the substrate. Furthermore, dummy plating layer 62 is formed on the surroundings of respective product plating layers 61. Thereafter, the whole plating layer is removed while leaving product plating layers 61 and dummy plating layer 62 on the upper surface of resin insulating layer 27.

Figure 23:
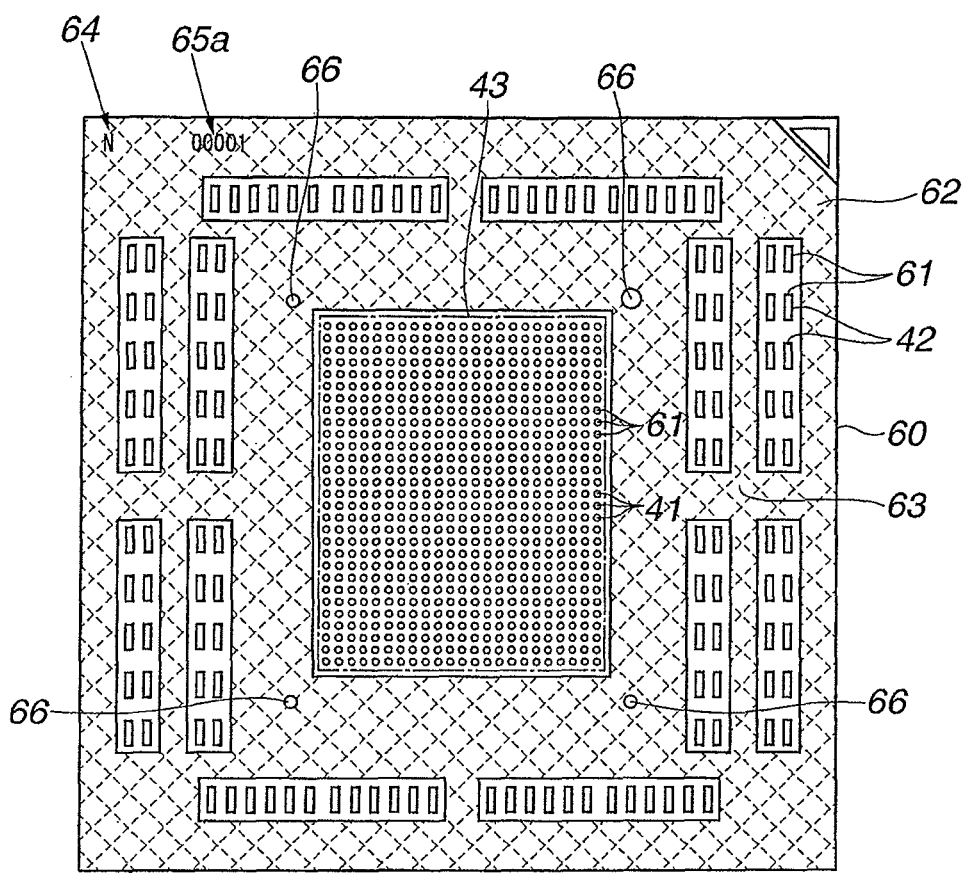
FIG. 23 is an explanatory view representing the method of manufacturing the multilayer wiring substrate in the third preferred embodiment.

As shown in FIG. 23, dummy plating layer 62 in this embodiment is formed as a plane shaped pattern conductor layer so as to cover the almost whole surface of the upper surface of resin insulating layer 27 except the formation region of IC chip connecting terminals 41 (chip mounting region 43) and the formation regions of capacitor connecting terminals 42. This dummy plating layer 62 in this embodiment is formed to have a mesh 63 which provides a mesh shaped recess pattern corresponding to pattern 74. Furthermore, recess patterns 64, 65a which accord with recognition mark 71 of the letter and recognition mark 72 of the numerals are formed at positions of dummy plating layer 62 located at the outer edge section. Recess patterns 66 which accord with positioning purpose recognition marks 73 are formed at positions located in the vicinity to the corner sections of chip mounting region 43.

Figure 24:
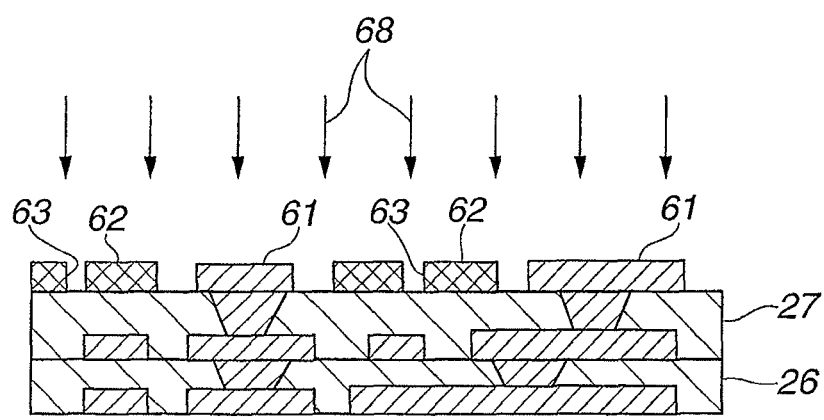
FIG. 24 is an explanatory view representing the method of manufacturing the multilayer wiring substrate in the third preferred embodiment.

After the plating layer forming process, as shown in FIG. 24, a heat treatment in which hot wind at, for example, 180° C. is applied from an upper position to the resin surface of outermost resin insulating layer 27 is carried out (a recognition mark forming process). This heat treatment causes mesh 63 and recess patterns 64, 65a, 66 on dummy plating layer 62 to be formed and to change the color of the resin surface of exposed resin insulating layer 27. In addition, the heat treatment, herein, serves as annealing, hardens resin insulating layer 27, and opens the internal stress applied to product plating layers 61.

When the above-described build-up process is carried out, wiring lamination body 60 in which laminated layer metal sheet body 54, resin insulating layers 20 through 27, conductor layers 28, product plating layers 61, and dummy plating layer 62 are laminated is formed on base material 52.

Figure 25:
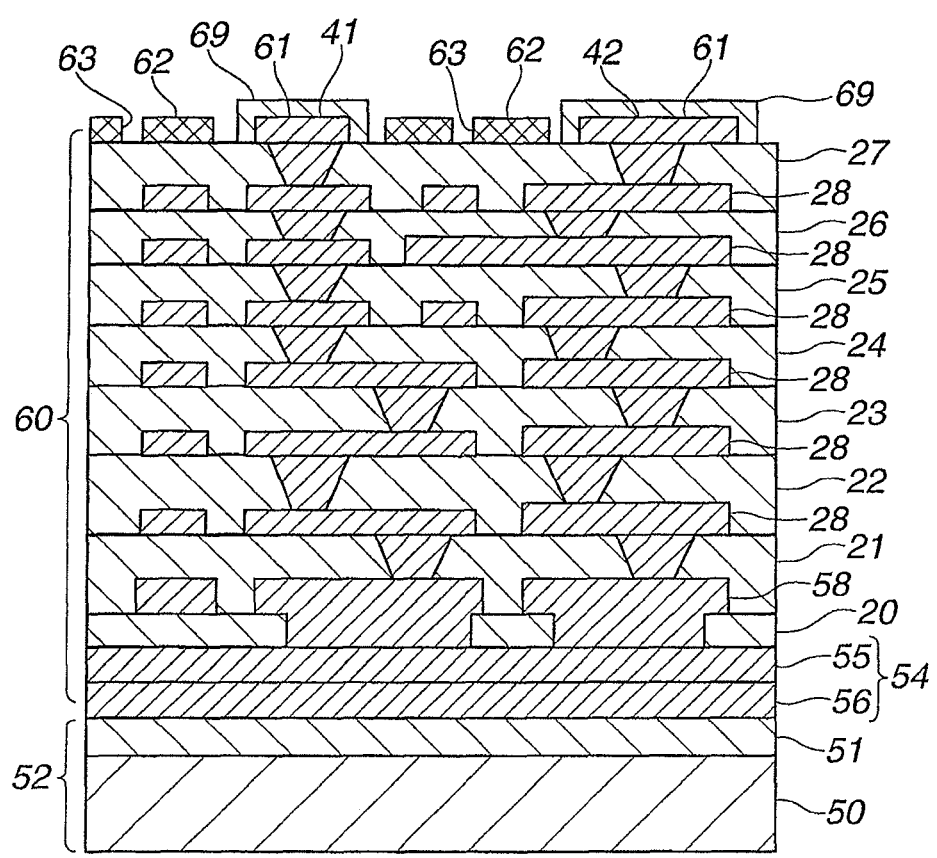
FIG. 25 is an explanatory view representing the method of manufacturing the multilayer wiring substrate in the third preferred embodiment.

An etching resist forming purpose dry film is laminated on the upper surface of wiring lamination body 60 and the exposure and development are carried out for the same dry film to form etching resists 69 (refer to FIG. 25) to cover the surfaces of product plating layers 61.

After etching resists 69 are formed, a dicing device (not shown) is used to cut wiring lamination body 60 to remove a surrounding area of a part providing wiring lamination section 30. This cut makes an outer edge section of laminated layer metal sheet body 54 sealed with resin insulating layer 20 in an exposed state. In other words, the removal of this surrounding area causes a loss of a close contact portion between groundwork resin insulating layer 51 and resin insulating layer 20. Consequently, wiring lamination section 30 and base material 52 are linked together via only laminated layer metal sheet body 54.

Figure 26:
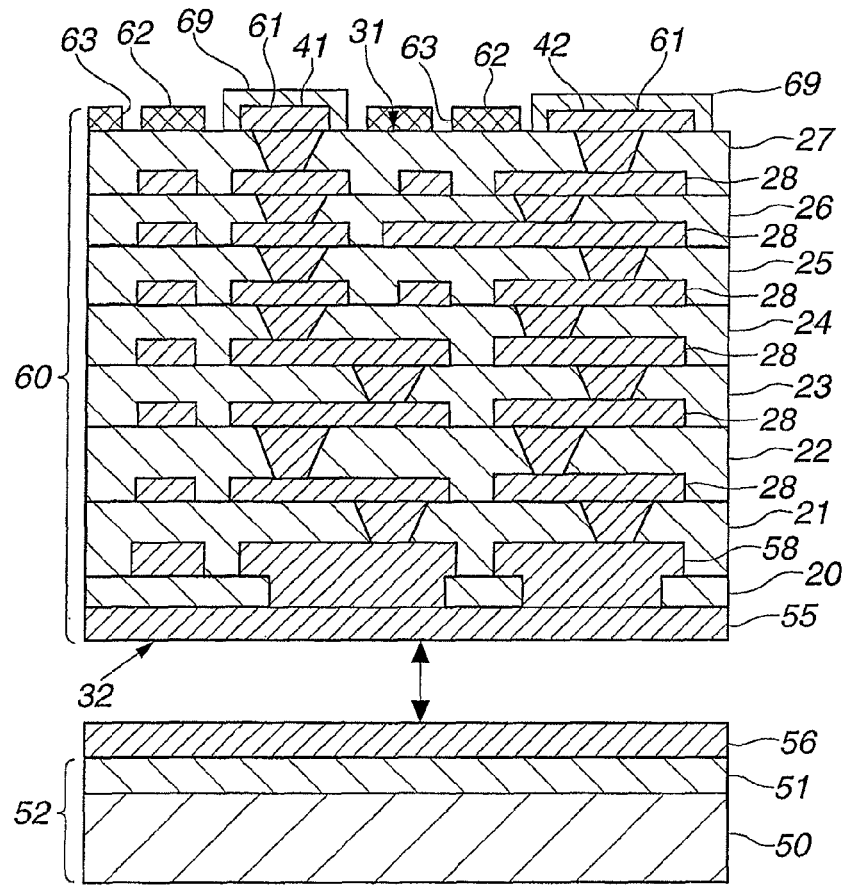
FIG. 26 is an explanatory view representing the method of manufacturing the multilayer wiring substrate in the third preferred embodiment.

It should, herein, be noted that, as shown in FIG. 26, pair of copper foils 55, 56 are exfoliated at an interface between the pair of copper foils in laminated layer metal sheet body 54. Thus, base material 52 is removed from wiring lamination section 30 to expose copper foil 55 located on lower surface 32 of wiring lamination section 30 (a base material separating process).

Figure 27:
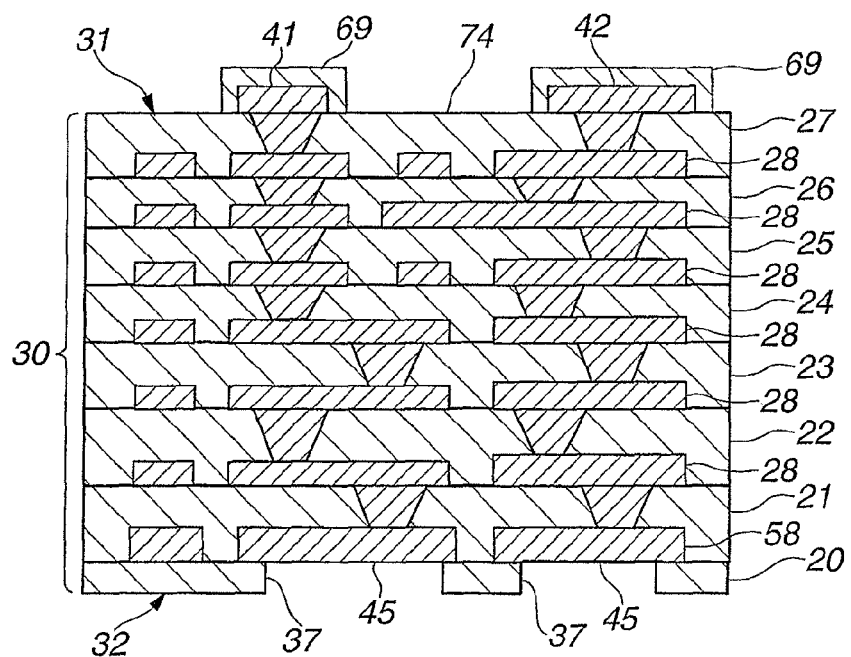
FIG. 27 is an explanatory view representing the method of manufacturing the multilayer wiring substrate in the third preferred embodiment.

Thereafter, the etching is carried out for wiring lamination section 30 to remove dummy plating layer 62 exposed at upper surface 31 side of wiring lamination section 30 (a dummy plating layer removing process). At the same time, copper foil 55 exposed at lower surface 32 side of wiring lamination section 30 is wholly removed and a part of the lower side of metal conductor section 58 is removed. Consequently, openings 37 are formed within resin insulating layer 20 and metal conductor section 58 left within openings 37 provide mother board connecting terminals 45 (refer to FIG. 27). In addition, dummy plating layer 62 is removed through the etching so that the surface of resin insulating layer 27 whose color is not changed is exposed onto upper surface 31 of wiring lamination sections 30. Consequently, the difference of the shades of the color occurs on the resin surface in accordance with the shapes of mesh 63 and of recess patterns 64, 65a, 66 of dummy plating layer 62 and, according to the difference in the shades of the color, recognition marks 71 through 73 and reticulated pattern 74 are formed on the resin surface.

Furthermore, etching resists 69 formed on upper surface 31 of wiring lamination section 30 are removed.

Thereafter, electroless nickel plating and electroless gold plating are sequentially carried out for the surface of IC chip connecting terminals 41, the surface of capacitor connecting terminals 42, and the surface of mother board connecting terminals 45. Consequently, plating layers 46, 48 are formed on the surfaces of respective connecting terminals 41, 42, and 45. Thus, multilayer wiring substrate 10 in FIG. 20 is manufactured by carrying out the above-described processes.

Hence, the following effects can be obtained in the third preferred embodiment according to the second feature of the present invention.

(1) In multilayer wiring substrate 10 in the third embodiment, recognition marks 71 through 73 are formed according to the difference in the shades of color of the resin surface on upper surface 31 of multilayer wiring substrate 10 on which the IC chip is to be mounted. In this case, since recognition marks 71 through 73 can be recognized without forming the conductor layers and openings as in the case of the prior art, the manufacturing cost of multilayer wiring substrate 10 can be suppressed.

(2) In multilayer wiring substrate 10 in the third embodiment, positioning mark 76 is furthermore provided which is recognized according to the difference in the optical reflectance between the resin surface of outermost resin insulating layer 27 and the surface of conductor section 75. In this way, recognition marks 71 through 73 according to the difference in the shades of the color and positioning mark 76 according to the difference in the optical reflectance can be formed according to the purposes. In addition, the position at which positioning mark 76 is formed can quickly and accurately be recognized according to the difference in the optical reflectance. Therefore, the positioning of multilayer wiring substrate 10 can more accurately be carried out. Furthermore, recognition marks 73 are marks to position the IC chip and are disposed in the vicinity to chip mounting region 43. Each recognition mark 73 is formed according to the difference in the shades of the color but is not formed on conductor section 75. Therefore, such a problem that the IC chip is erroneously connected to conductor section 75 can be avoided.

(3) In multilayer wiring substrate 10 in the third embodiment, reticulated pattern 74 is formed according to the difference in the shades of the color of the resin surface of outermost resin insulating substrate 27. This pattern 74 is regularly formed on the whole upper surface of resin insulating layer 27 so that a design characteristic of multilayer wiring substrate 10 can be increased.

(4) In the third embodiment, the heat treatment to change the color of the resin surface of resin insulating layer 27 is carried out to form recognition marks 71 through 73. This heat treatment also serves as annealing for resin insulating layer 27. In this case, it is not necessary to perform separate heat treatments for the annealing process and for the recognition mark forming process, the separate heat treatments having conventionally been carried out. Thus, the manufacturing cost of multilayer wiring substrate 10 can be suppressed to be low.

(5) In the third embodiment, the dummy plating layer removing process is carried out after the base material separating process. In this case, at the same time when dummy plating layer 62 on upper surface 31 of multilayer wiring substrate 10 is removed by means of the etching, copper foil 55 on the lower surface 32 side can be removed by the etching. In this way, multilayer wiring substrate 10 can be manufactured at the same labor hour as the conventional manufacturing method and the manufacturing cost can be suppressed to be low.

(6) In the third embodiment, dummy plating layer 62 is formed at the surroundings of product plating layers 61 in addition to product plating layers 61 which provide IC chip connecting terminals 41 and capacitor connecting terminals 42, on upper surface 31 of multilayer wiring substrate 10. Thus, the rate of area of plating layers 61, 62 in upper surface 31 of multilayer wiring substrate 10 can be increased. Thus, the current concentration at the time of plating can be avoided and the dispersion of thickness of product plating layers 61 can be eliminated. Consequently, in multilayer wiring substrate 10, the plurality of IC chip connecting terminals 41 and the plurality of capacitor connecting terminals 42 can be formed with the uniform thickness. Hence, if multilayer wiring substrate 10 is used, the connection reliability between the chip components such as IC chip and chip capacitors and respective connecting terminals 41, 42 can be improved.

[Fourth Embodiment]

Figure 28:
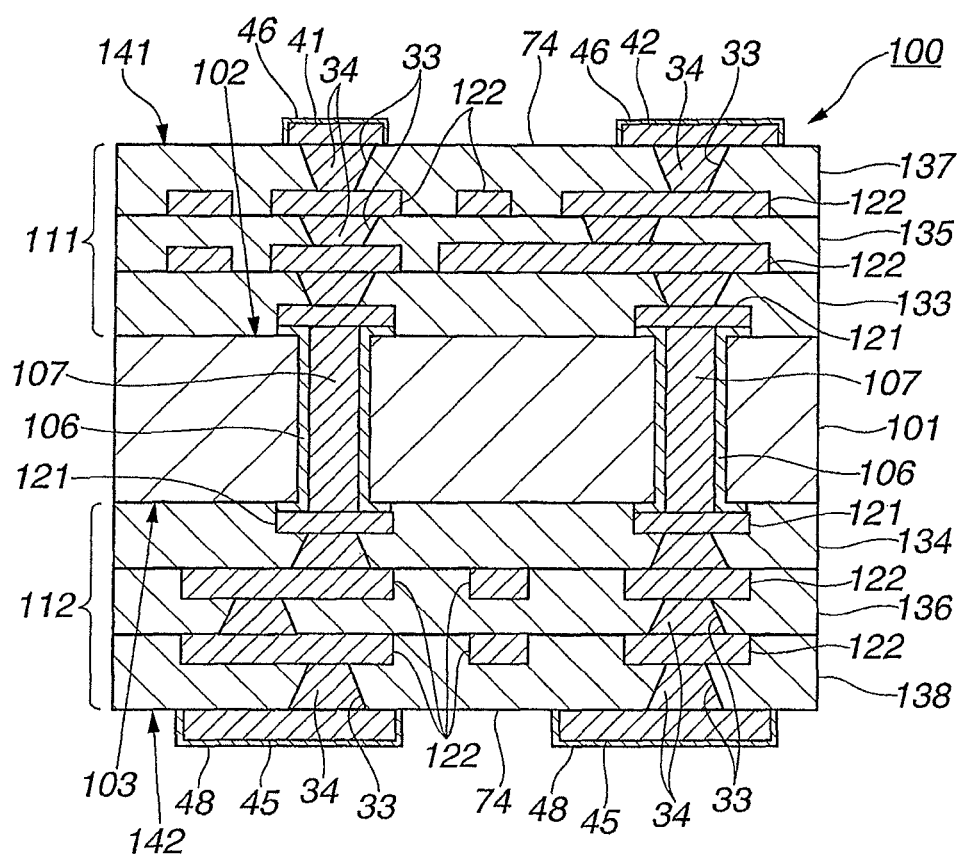
FIG. 28 is a cross sectional view representing the rough configuration of the multilayer wiring substrate in a fourth preferred embodiment.

A fourth preferred embodiment which embodies the second feature according to the present invention will be described in details on a basis of the attached drawings. FIG. 28 is an enlarged cross sectional view representing a rough configuration of the multilayer wiring substrate in the fourth embodiment. In the third embodiment, the coreless wiring substrate formed so as not to include the core substrate is embodied. However, in the fourth embodiment, the present invention embodies the multilayer wiring substrate having the core substrate. The structure and manufacturing method of this multilayer wiring substrate are basically the same as the second embodiment. Hence, only the features different from the second embodiment will be described hereinbelow.

Recognition marks 71, 72, 73 (refer to FIG. 21) formed according to the difference in the shades of the color of the resin surface are disposed on outermost resin insulating layer 137 exposed at the upper surface side of first build-up layer 111, in multilayer wiring substrate 100 in the fourth embodiment, in the same way as multilayer wiring substrate 10 in the third embodiment. In addition, reticulated pattern 74 formed according to the difference in the shades of the color of the resin surface is formed on the outermost resin insulating layer 137.

Furthermore, reticulated pattern 74 formed according to the difference in the shades of the color of the resin surface is disposed on outermost resin insulating layer 138 exposed at the lower surface side of second build-up layer 112. It should be noted that, in multilayer wiring substrate 100, from among recognition marks 71, 72, and 73, recognition mark 71 of the letter representing the company's name and recognition mark 72 of numerals representing the product number may be formed not on the upper surface side of first build-up layer 111 but on the lower surface side of second build-up layer 112.

Next, the method of manufacturing multilayer wiring substrate 100 in the fourth embodiment will be described below.

As described above, the manufacture of this multilayer wiring substrate 100 is basically the same as the second embodiment. Hence, only the processes different from the second embodiment will be described below.

Figure 29:
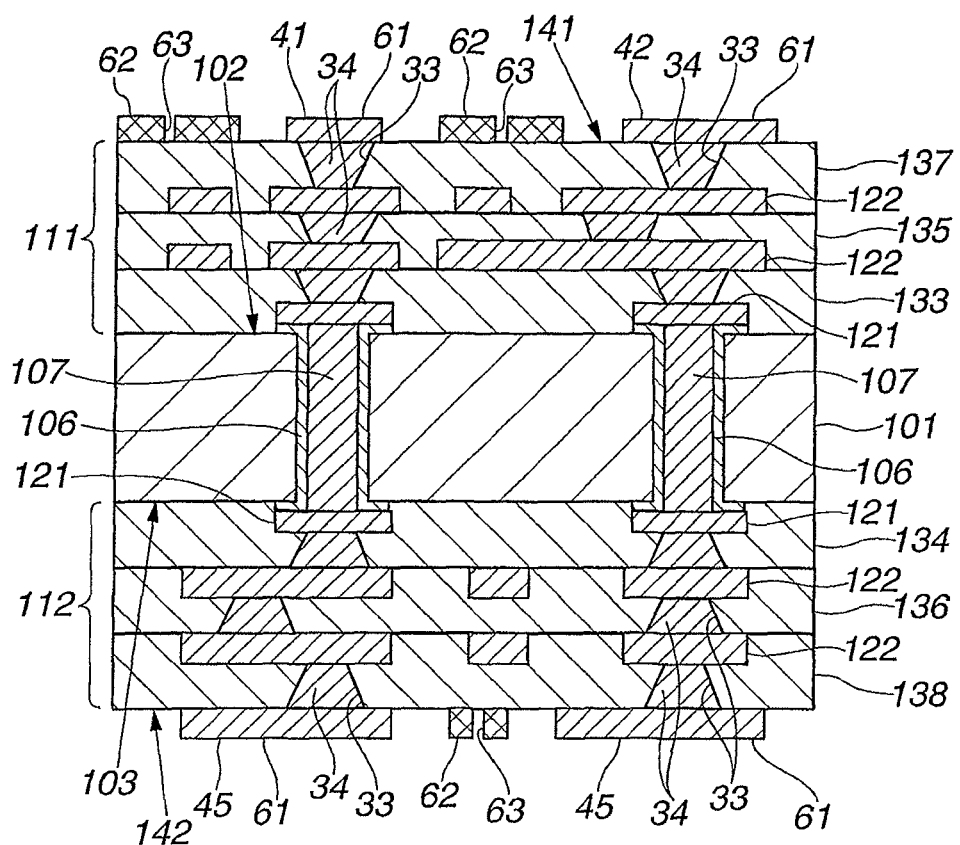
FIG. 29 is an explanatory view representing the method of manufacturing the multilayer wiring substrate in the fourth preferred embodiment.

The same procedure as the second embodiment is carried out up to the process in which dummy plating layer 62 is formed (refer to FIG. 29). In addition, product plating layers 61 which provide mother board connecting terminals 45 are formed and dummy plating layer 62 is formed at the surroundings of product plating layers 61, on lower surface 142 of resin insulating layer 138 which is the outermost layer of second build-up layer 112 (refer to FIG. 29).

It should be noted that mesh 63 corresponding to reticulated pattern 74 is formed on dummy plating layer 62 formed on upper surface 141 of resin insulating layer 137 and recess patterns 64, 65a, 66 corresponding to respective recognition marks 71, 72, 73 (refer to FIG. 23) are formed on the same dummy plating layer 62. Mesh 63 corresponding to reticulated pattern 74 is formed on dummy plating layer 62 formed on lower surface 142 of resin insulating layer 138.

Figure 30:
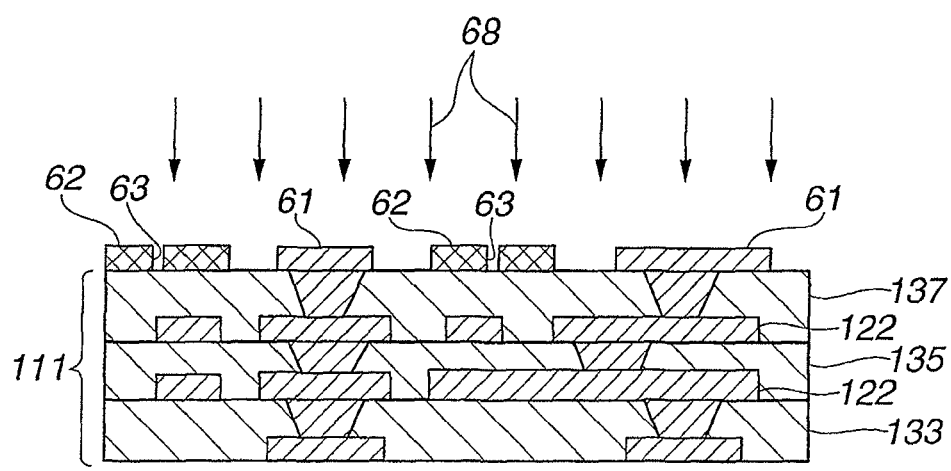
FIG. 30 is an explanatory view representing the method of manufacturing the multilayer wiring substrate in the fourth preferred embodiment.
Figure 31:
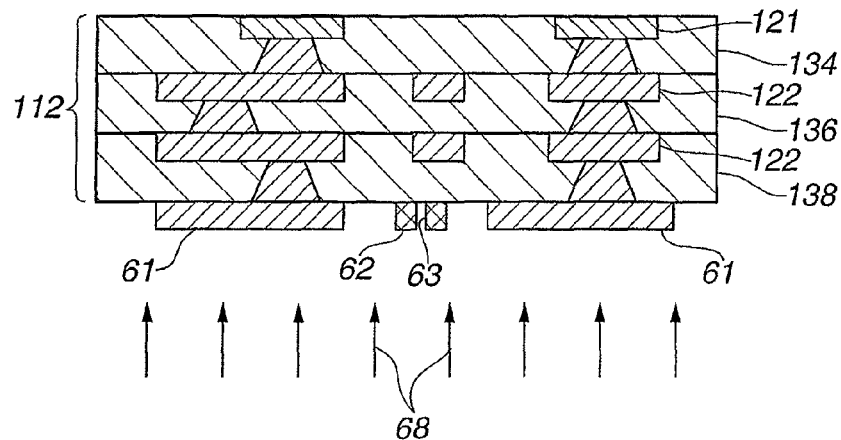
FIG. 31 is an explanatory view representing the method of manufacturing the multilayer wiring substrate in the fourth preferred embodiment.

The heat treatment is carried out in which hot wind 68 is applied onto the resin surface of resin insulating layer 137 which provides the outermost layer of first build-up layer 111 from the upper direction of the resin surface after the formation of each plating layer 61, 62 (refer to FIG. 30). This heat treatment causes each of mesh 63 and recess patterns 64, 65a, 66 to be formed on dummy plating layers 62 and to change the color of the resin surface of exposed resin insulating layer 137. At the same time, the heat treatment in which hot wind 68 is applied from the lower direction onto the resin surface of resin insulating layer 138 which provides the outermost layer of second build-up layer 112 is carried out (refer to FIG. 31). Thus, this heat treatment causes mesh 63 to be formed on dummy plating layer 62 and to change the color of the resin surface of exposed resin insulating layer 138.

Figure 32:
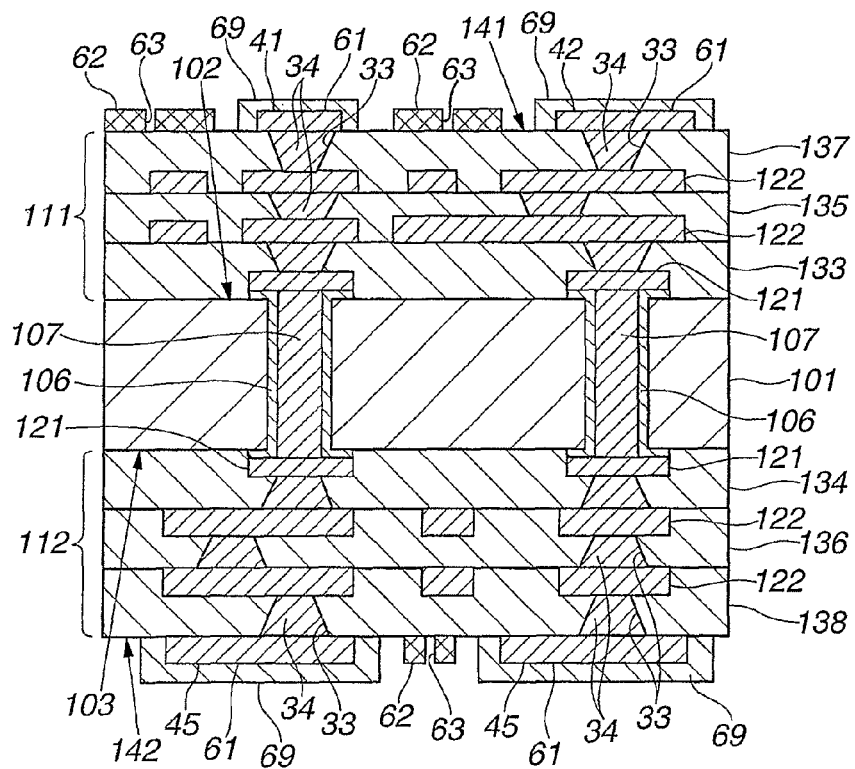
FIG. 32 is an explanatory view representing the method of manufacturing the multilayer wiring substrate in the fourth preferred embodiment.

Thereafter, the etching resist forming purpose dry film is laminated on upper surface 141 of resin insulating film 137 in first build-up layer 111 and the exposure and development are carried out for the same dry film to form etching resists 69 which cover the surfaces of respective product plating layers 61 (refer to FIG. 32). Furthermore, the etching resist forming purpose dry film is laminated on lower surface 142 of resin insulating film 138 in second build-up layer 112 and the exposure and development are carried out for the same dry film to form etching resists 69 which cover respective product plating layers 61 (refer to FIG. 32).

The etching is carried out after the formation of etching resists 69 so that dummy plating layer 62 which is exposed on each of the surfaces of respective build-up layers 111, 112 and, thereafter, etching resists 69 are removed. At this time, the removal of dummy plating layer 62 causes the surface of resin insulating layer 137 whose color is not changed to be exposed onto upper surface 141 of first build-up layer 111 and causes the surface of resin insulating layer 138 whose color is not changed to be exposed onto lower surface 142 of second build-up layer 112. Consequently, the difference in the shades of the color occurs on the resin surface of resin insulating layer 137 according to the shapes of mesh 63 and recess patterns 64, 65a, 66 of dummy plating layer 62. Then, recognition marks 71, 72, 73 and reticulated pattern 74 are formed according to the difference in the shades of the color described above. In addition, the difference in the shades of the color occurs, on the resin surface of resin insulating layer 138, according to the shape of mesh 63 and reticulated pattern 74 is formed according to this difference in the shades of the color.

Thereafter, the electroless nickel plating and electroless gold plating are sequentially carried out for the surface of IC chip connecting terminals 41, the surface of capacitor connecting terminals 42, and the surface of mother board connecting terminals 45. Consequently, plating layers 46, 48 are formed on the surfaces of respective connecting terminals 41, 42, 45. By carrying out the above-described processes, multilayer wiring substrate 100 shown in FIG. 16 is manufactured.

Hence, according to the fourth embodiment which embodies the second feature of the present invention, the following effects can be obtained.

(1) Recognition marks 71, 72, 73 are formed according to the difference in the shades of color of the resin surface on upper surface 141 of first build-up layer 111 on which the IC chip is to be mounted, in multilayer wiring substrate 100 of this embodiment. In this case, recognition marks 71, 72, 73 can be recognized without forming the conductor layers and openings as in case of the prior art so that the manufacturing cost of multilayer wiring substrate 100 can be suppressed.

(2) In multilayer wiring substrate 100 in the fourth embodiment, reticulated pattern 74 according to the difference in the shades of color of the resin surface is formed on upper surface 141 of first build-up layer 111 and on lower surface 142 of second build-up layer 112. As described above, a design characteristic of multilayer wiring substrate 100 can sufficiently be increased.

It should be noted that each of the third and fourth embodiments according to the present invention may be modified as will be described below.

Dummy plating layer 62 is formed so as to cover the almost whole surface, in the surfaces of resin insulating layers 27, 137, 138, except the forming regions of respective connecting terminals 41, 42, 45, in each of the third and fourth embodiments. The present invention is not limited to this. For example, dummy plating layer 62 may be formed on only the forming regions of recognition marks 71 through 73. As in the third and fourth embodiments, in a case where plane shaped dummy plating layer 62 having the wide area is formed, the thickness dispersion of product plating layers 61 which provide respective connecting terminals 41, 42, 45 can be suppressed. In addition, in this case, mesh 63 is formed on dummy plating layer 62 so that reticulated pattern 74 can be formed on the whole surface of the substrate. It should be noted that reticulated pattern 74 may be a pattern other than the reticulated pattern and may be a pattern such that a pictorial pattern or flower pattern of circular shape and polygon shape is regularly aligned.

In the third and fourth embodiments, recognition mark 71 representing the company's name or so forth and recognition mark 72 representing the product number are formed on the outer edge section of upper surfaces 31, 141 of multilayer wiring substrates 10, 100. The formation positions of these recognition marks 71, 72 can appropriately be modified.

For example, recognition mark 72 representing the product number may be formed in the vicinity to chip mounting region 43. In addition, in a case where pattern 74 is not formed, recognition mark 71 representing the company's name may be formed using the exposed whole surface of resin insulating layers 27, 137. These recognition marks 71, 72 are formed according to the difference in the shades of the color of the resin surface. Therefore, even if respective recognition marks 71, 72 are formed in the vicinity to respective connecting terminals 41, 42 and to positioning mark 76, no influence is given to the connections to respective connection terminals 41, 42, to the detection of positioning mark 76, and so forth.

In above-described multilayer wiring substrate 10 of the third embodiment, positioning mark 76 which is recognized according to the difference in the optical reflectance between the resin surface and the surface of conductor section 75 is formed on the surface of resin insulating layer 27 which provides the outermost layer. The present invention is not limited to this. Positioning mark 76 may be formed by providing conductor section 75 on the surface of resin insulating layer 26 of the second layer and providing the opening to expose the surface of conductor section 75 to resin insulating layer 27 which is the outermost layer. In this way, positioning mark 76 can be recognized according to the difference in the optical reflectance between the surface of resin and the surface of conductor section 75.

In each of the first, second, third, and fourth embodiments, IC chip connecting terminals 41 and capacitor connecting terminals 42 are disposed as chip component connecting terminals on upper surface 31, 141 of multilayer wiring substrate 10, 100. However, capacitor connecting terminals 42 may be omitted but only IC chip connecting terminals 41 may be formed. In addition, other chip component connecting terminals to mount the chip components such as chip inductors and so forth thereon may be disposed on upper surface 31, 141 of multilayer wiring substrate 10, 100 other than IC chip connecting terminals 41 and capacitor connecting terminals 42.

In each of the first, second, third, and fourth embodiments, product plating layers 61 and dummy plating layer 62 are formed through copper plating. However, product plating layers 61 and dummy plating layer 62 may be formed through another plating such as a tinning, a nickel plating, or so forth. However, in a case where product plating layers 61 and dummy plating layer 62 are formed through copper plating, electrical resistances of IC chip connecting terminals 41 and capacitor connecting terminals 42 can be suppressed to be low and become practically favorable.

Next, the technical ideas grasped from each of the third and fourth embodiments described above other than the technical ideas described in the claims will hereinafter be listed.

(1) The multilayer wiring substrate as set forth in means 2, wherein the recognition mark is a positioning mark.

(2) The method of manufacturing the multilayer wiring substrate as set forth in means 3, the product plating layers and the dummy plating layer are formed through a copper plating.

(3) The method of manufacturing the multilayer wiring substrate as set forth in means 3, wherein the recognition mark forming process serves as an annealing.

(4) The method of manufacturing the multilayer wiring substrate as set forth in means 3, wherein the heat treatment carried out at the recognition mark forming process is a process in which hot wind is applied onto the surface of the exposed resin insulating layer.

(5) The method of manufacturing the multilayer wiring substrate as set forth in means 3, wherein the resin insulating layer is formed using a build-up material mainly constituted by a thermosetting resin.

(6) The method of manufacturing the multilayer wiring substrate as set forth in means 2, wherein the method includes: a lamination process for laminating the plurality of resin insulating layers and the plurality of conductor layers on a supporting base material via a metal foil; a plating layer forming process for forming product plating layers constituting the plurality of chip component connecting terminals and a dummy plating layer having a shape corresponding to the recognition mark on the surface of an outermost resin insulating layer exposed at the principal plane side of the substrate; a recognition mark forming process for changing a color of the outermost resin insulating layer and performing an annealing through a heat treatment of the outermost resin insulating layer; a resist forming process for forming etching resists to cover the product plating layers at the principal plane side of the substrate; a base material separating process for separating the supporting base material at an interface of the metal foil to expose the metal foil onto the rear plane side of the substrate; and a removing process for removing the dummy plating layer exposed onto the principal plane side of the substrate through the etching and, at the same time, removing the metal foil exposed onto the rear plane side of the substrate through the etching.

Explanations of Signs 10, 100 . . . multilayer wiring substrate 20~27, 133~138 . . . resin insulating layers 28, 122 . . . conductor layers 31, 141 . . . upper surface as a principal plane of the substrate 32, 142 . . . lower surface as a rear plane of the substrate 41 . . . IC chip connecting terminals as chip component connecting terminals 42 . . . capacitor connecting terminals as the chip component connecting terminals 52 . . . supporting base material 55 . . . copper foil as metal foil 61 . . . product plating layers 62 . . . dummy plating layer 65 . . . etching resists 69 . . . etching resists 71~73 . . . recognition marks 74 . . . pattern 75 . . . conductor section 76 . . . positioning mark

What is claimed is:

1. A multilayer wiring substrate comprising: a principal plane of the substrate; a rear plane of the substrate; a plurality of resin insulating layers; a plurality of conductor layers, both of the plurality of resin insulating layers and the plurality of conductor layers being laminated; and a plurality of chip component connecting terminals to which chip components are connectable, wherein one of the plurality of resin insulating layers which is an outermost layer and is exposed at the principal plane side of the substrate is provided with a recognition mark formed according to a difference between shades of a color of a resin surface.

2. The multilayer wiring substrate as claimed in claim 1, wherein a conductor section is exposed at an outer edge section of the principal plane side of the substrate and the multilayer wiring substrate further comprises a positioning mark which is recognized according to a difference in an optical reflectance between the resin surface of the outermost resin insulating layer and the surface of the conductor section.

3. The multilayer wiring substrate as claimed in claim 1, wherein, on the resin insulating layer which is the outermost layer and is exposed at the principal plane side of the substrate, a pattern formed according to the difference in the shades of the color of the resin surface and in which a picture of a predetermined pattern is regularly arrayed is provided.

4. A method of manufacturing the multilayer wiring substrate described in claim 1, comprising:
a plating layer forming process for forming product plating layers which provide the plurality of chip component connecting terminals on a surface of the outermost resin insulating layer which is exposed at the principal plane side of the substrate and forming a dummy plating layer having a shape corresponding to the recognition mark;
a recognition mark forming process for changing a color of the surface of the outermost insulating layer by a heat treatment for the outermost resin insulating layer; and
a dummy plating layer removing process for removing the dummy plating layer through an etching after forming etching resists to cover the product plating layers at the principal plane side of the substrate.

5. A method of manufacturing a multilayer wiring substrate, the multilayer wiring substrate having a principal plane of the substrate and a rear plane of the substrate, having a structure such that a plurality of resin insulating layers and a plurality of conductor layers are laminated, and having a plurality of chip component connecting terminals to which chip components are connectable, the method comprising a plating layer forming process for forming product plating layers which provide the plurality of chip component connecting terminals on a surface of one of the resin insulating layers which is an outermost layer and is exposed at the principal plane side of the substrate and forming a dummy plating layer on surroundings of the product plating layers.

6. The method of manufacturing the multilayer wiring substrate as claimed in claim 5, wherein the method further comprises: a resist forming process for forming etching resists to cover the product plating layers on the principal plane side of the substrate; and a plating layer removing process for removing the dummy plating layer exposed at the principal plane side of the substrate through an etching.

7. The method of manufacturing the multilayer wiring substrate as claimed in claim 5, wherein, in the plating layer forming process, the dummy plating layer such that a rate of area of the plating layers to a surface area of the principal plane of the substrate is equal to or larger than 60% but equal to or smaller than 95% is formed.

8. The method of manufacturing the multilayer wiring substrate as claimed in claim 6, wherein the method further comprises: a lamination process for laminating the plurality of resin insulating layers and the plurality of conductor layers on a supporting base material via a metal foil; and a base material separating process for separating the supporting base material at an interface of the metal foil to expose the metal foil at the rear plane side of the substrate and wherein the plating layer removing process follows the base material separating process and, at the same time when the dummy plating layer on the principal plane side of the substrate is removed through the etching, the metal foil on the rear plane side of the substrate is removed through the etching.

9. The method of manufacturing the multilayer wiring substrate as claimed in claim 5, wherein, in the plating layer forming process, in a case where a rate of area of the dummy plating layer occupied in a dummy plating layer forming region defined by an outer edge of the dummy plating layer is equal to or larger than 30% but is equal to or smaller than 100%, the dummy plating layer such that a distance between each of the product plating layers and the dummy plating layer is equal to or larger than 0.1 mm but is equal to or smaller than 10 mm is formed.

10. The method of manufacturing the multilayer wiring substrate as claimed in claim 9, wherein, in a case where the plurality of chip component connecting terminals are a plurality of IC chip connecting terminals to which an IC chip constituting one of the chip components is connectable, a longitudinal dimension of a rectangular chip mounting region in which the plurality of IC chip connecting terminals are arrayed and a lateral dimension thereof are X (cm) and Y (cm), and a design value of a thickness of the product plating layers at the plurality of the IC chip connecting terminals is Z(μm), a standard deviation σ(μm) of actual measurement values of the thickness of the product plating layers is expressed as described in the following equation:

$$\sigma \leq 1.5 \times (Z/15) \times \left( \frac{\sqrt{X^2 + Y^2}}{\sqrt{2}} \right).$$

* * * * *